United States Patent
Barker et al.

(10) Patent No.: US 9,929,192 B1
(45) Date of Patent: Mar. 27, 2018

(54) ULTRAVIOLET (UV) SCHOTTKY DIODE DETECTOR HAVING SINGLE CRYSTAL UV RADIATION DETECTOR MATERIAL BONDED DIRECTLY TO A SUPPORT STRUCTURE WITH PROPER C-AXIS ORIENTATION

(71) Applicant: Raytheon Company, Waltham, MA (US)

(72) Inventors: Delmar L. Barker, Tucson, AZ (US); Jeffrey Clarke, Rio Rico, AZ (US); Charles W. Hicks, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/278,656

(22) Filed: Sep. 28, 2016

(51) Int. Cl.
| | |
|---|---|
| H01L 31/02 | (2006.01) |
| H01L 27/144 | (2006.01) |
| G01J 1/42 | (2006.01) |
| H01L 31/0296 | (2006.01) |
| H01L 31/18 | (2006.01) |
| H01L 31/09 | (2006.01) |
| H01L 31/0232 | (2014.01) |

(52) U.S. Cl.
CPC ............ *H01L 27/144* (2013.01); *G01J 1/429* (2013.01); *H01L 31/0296* (2013.01); *H01L 31/02327* (2013.01); *H01L 31/09* (2013.01); *H01L 31/1836* (2013.01); *H01L 31/1872* (2013.01)

(58) Field of Classification Search
CPC ....... H01L 27/14; H01L 27/144; H01L 31/02; H01L 31/023; H01L 31/0232; H01L 31/02327; H01L 31/09; H01L 31/18; H01L 31/183; H01L 31/1836; H01L 31/187; H01L 31/1872; G01J 1/429
USPC .......................................................... 257/58
See application file for complete search history.

(56) References Cited

U.S. PATENT DOCUMENTS

| | | | |
|---|---|---|---|
| 4,000,502 | A | 12/1976 | Butler et al. |
| 4,319,258 | A | 3/1982 | Harnagel et al. |
| 2003/0015716 | A1 | 1/2003 | Valliath |
| 2005/0139966 | A1* | 6/2005 | Scarlete ................ C23C 16/325 257/632 |
| 2012/0181645 | A1 | 7/2012 | De Lamaestre et al. |
| 2016/0111579 | A1* | 4/2016 | Shi ......................... H01L 31/109 257/73 |

OTHER PUBLICATIONS

Andrzej Szczerbakow, Self-Selecting Vapor Growth of Monocrystals: An Alternative in the Area of Wide-Gap II-IV Solid Solutions, Crystal Growth & Design, 2001, vol. 1, No. 3, pp. 183-185 (3 pages).

(Continued)

*Primary Examiner* — Monica D Harrison
(74) *Attorney, Agent, or Firm* — Daly, Crowley, Mofford & Durkee, LLP

(57) ABSTRACT

A radiation detector for detecting ultraviolet energy having a single crystal UV radiation detector material and an amorphous support layer disposed directly on the single crystal UV radiation detector material with the single crystal UV radiation detector material having a c-axis aligned along a direction of the ultraviolet energy being detected.

19 Claims, 44 Drawing Sheets

(56) References Cited

OTHER PUBLICATIONS

P.R. Kamadjiev, M.M. Gospodinov, On the Morphology of Cadmium Sulphide Epitaxial Layers on Germanium, Oberservation of Six-Pointed Star Optic Figures and their Explanation, Institute of Solid State Physics, Bulgarian Academy of Sciences Sofia, Bulgaria, 1977, vol. 12, No. 6, pp. 573-586 (15 pages).
L. Clarke and J. Woods, The preparation of large single crystals of cadmium sulphide, Department of Applied Physics, University of Durham, Brit. J. Appl. Phys., 1966, vol. 17, pp. 319-325 (8 pages).
J.W. Sherohman, Two-Phase Annealing of Single Crystal CdS, Lawrence Livermore National Laboratory, University of California, Livermore, California 94550, Aug. 1981, vol. 128, No. 8; pp. 1817-1819 (3 pages).
P. Baeri, C. Spinella, R. Reitano, Fast Melting of Amorphous Silicon Carbide Induced by Nanosecond Laser Pulse, International Journal of Thermophysics, 1999, vol. 20, No. 4, pp. 1211-1221 (11 pages).
V.V. Anitpov, S.A. Kukushkin, A.V. Osipov, Epitaxial Growth of Cadium Sulfide Films on Silicon, Physics of the Solid State, 2016, vol. 58, No. 3, pp. 629-632 (4 pages).
Ciprian Iliescu, Daniel Poenar, Physics and Technology of Silicon Carbide Devices, PECVD Amorphous Silicon Carbide (a-SiC) Layers for MEMS Applications, Oct. 16, 2012, pp. 130-148 (19 pages).
U.S. Appl. No. 15/278,619, filed Sep. 28, 2016, 21 pages.
Alvin M. Goodman, Evaporated Metallic Contacts to Conducting Cadmium Sulfide Single Crystals, AIP Journal of Applied Physics, 1964, pp. 573-580 (9 pages).
John A. Scott-Monck, Arthur J. Learn, Rectifying Contacts Under Evaporated CdS, IEEE, Jan. 1968, pp. 68-89 (2 pages).
C. Paorici, C. Pelosi, G. Bolzoni, G. Zuccalli, Epitaxial growth of cadium sulphide on (111) germanium substrates, Journal of Materials Science 10, 1975, pp. 2117-2123 (7 pages).
V.V. Antipov, S.A. Kukushkin, A.V. Osipov, Epitaxial Growth of Cadium Sulfide Films on Silicon, ISSN 1063-7384, Physics of the Solid State, 2016, vol. 58, No. 3, pp. 629-632 (4 pages).
Michael Krumrey, Erich Tegeler, Jochen Barth, Michael Krisch, Franz Schäfers, Reinhard Wolf, Schottky type photodiodes as detectors in the VUV and soft x-ray range, Applied Optics, vol. 27, No. 20, Oct. 15, 1998, pp. 4336-4341 (6 pages).
L.C. Greene, D.C. Reynolds, S.J. Czyzak, W.M. Baker, Method for Growing Large CdS adn ZnS Single Crystals, AIP The Journal of Chemical Physics, vol. 29, No. 6, Dec. 1958, pp. 1375-1380 (7 pages).
Ralph M. Grant, Photoelectrically Induced Free Carrier Absorption and Amplification of Light in Cadmium Sulfide, Applied Optics, vol. 5, No. 2, Feb. 1966, pp. 333-341 (9 pages).
Raymond T. Tung, The physics and chemistry of the Schottky barrier height, AIP Applied Physics Review, 2014, pp. 0113041-011304-54 (55 pages).
G.H. Dierssen, T. Gabor, Seeded Growth of Large Single Crystals of CdS From the Vapor Phase, Journal of Crystal Growth 43, 1978, pp. 572-576 (5 pages).
F. Lisco, P.M. Kaminski, A. Abbas, J.W. Bowers, G. Claudio, M. Losurdo, J.M. Walls, High rate deposition of thin film cadmium sulphide by pulsed direct current magnetron sputtering, Thin Solid Films 574, 2015, pp. 43-51 (9 pages).
Alvin M. Goodman, Evaporated Metallic Contacts to Conducting Cadmium Sulfide Single Crystals, AIP Journal of Applied Physics, 1963, pp. 573-580 (9 pages).
C.K. Campbell, C.H. Morgan, Some Studies of Thin Film Diodes Utilizing Cadmium Sulphide and Sulpher, Thin Solid Films, 26, 1975, pp. 213-220 (8 pages).
C. Ghezzi, C. Paorici, C. Pelosi, Growth and Defect Structure of CdS Epitaxial Layers on (111)Ge Substrates, Journal of Crystal Growth 41, 1977, pp. 181-191 (11 pages).
F. Lisco, P.M. Kaminski, A. Abbas, J.W. Bowers, G. Claudio, M. Losurdo, J.M. Walls, High rate deposition of thin film cadmium sulphide by pulsed direct current magnetron sputt.
A.V. Kovda, L.L. Aksyonova, G.I. Distler, Y.M. Gerasimov, E.I. Kortukova, Growth of Monocrystalline CdS Films on Mica Surfaces Through Amorphous Interfacial Layers of Silicon.
Notification of Transmittal of the International Search Report and the Written Opinion of the International Searching Authority, or the Declaration, PCT/US2017/024912 dated Jul. 25, 2017, 1 page.
International Search Report, PCT/US2017/024912 dated Jul. 25, 2017, 5 pages.
Written Opinion of the International Searching Authority, PCT/US2017/024912, dated Jul. 25, 2017, 8 pages.
X.L. Tong, D.S. Jiang, W.B. Hu, Z.M. Liu, M.Z. Luo, The comparison between CdS thin films grown on Si(111) substrate and quartz substrate by femtosecond pulsed laser deposition, Appl. Phys. A 84, Mar. 25, 2006, (3 pages).
Keno-Te Lin, Hsuen-Li Chen, Yu-Sheng Lai, Yu-Lun Liu, Yi-Chuan Tseng, Cheng-His Lin, Nanocrystallized CdS beneath the Surface of a Photoconductor for Detection of UV Light with Picowatt Sensitivity, Applied Materials & Interfaces, 2014, 19866-19874 (5 pages).
Non-Final Office Action, U.S. Appl. No. 15/278,619, dated Oct. 3, 2017, 13 pages.

* cited by examiner

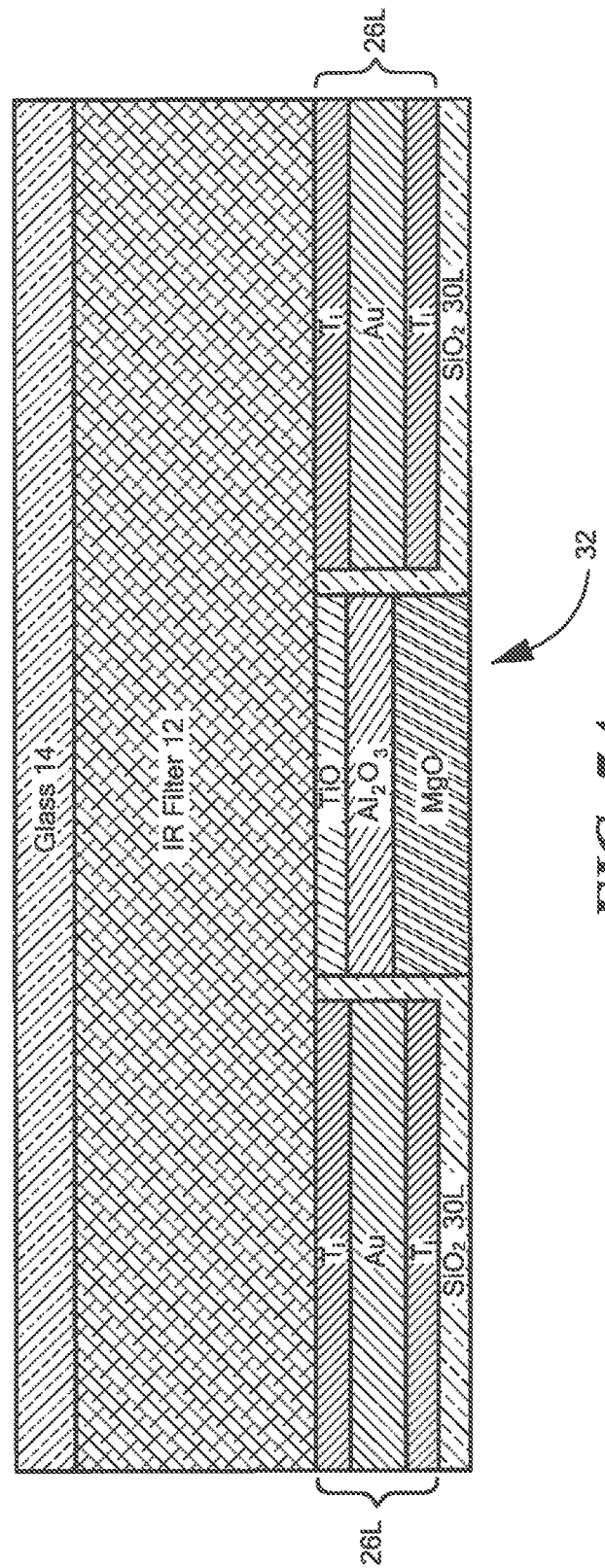

ULTRAVIOLET (UV) SCHOTTKY DIODE DETECTOR HAVING SINGLE CRYSTAL UV RADIATION DETECTOR MATERIAL BONDED DIRECTLY TO A SUPPORT STRUCTURE WITH PROPER C-AXIS ORIENTATION

TECHNICAL FIELD

This disclosure relates generally to ultraviolet (UV) detectors and method for forming such detectors and more particularly to UV detectors and methods for forming such detectors adapted for use in dual band UV and infrared (IR) detectors.

BACKGROUND

As is known in the art, UV detectors are used in many applications including dual band IR and UV detectors. One method used to produce the Cadmium Sulfide (CdS), in hexagonal form, for such UV detectors, for example, has been to grow bulk CdS material starting with a CdS seed crystal using a vapor phase process as described in a paper entitled "SEEDED GROWTH OF LARGE SINGLE CRYSTALS OF CdS FROM VAPOR PHASE" by G. H. Dierssen and T. Gabor, 1978 published in Journal of Crystal Growth 43 (1978) 572-576. Wafers are sliced from this bulk crystal material, annealed, polished and etched to prepare them for use as Schottky diode UV detector. More particularly, the CdS layer is then cut or sliced into the appropriate thickness by slicing and dicing and then re-annealed in hot sulfur atmosphere to achieve detector electrical properties. In the case of a dual band UV and IR detector, then CdS is then glued to the surface of an infrared filter configured to pass the infrared portion of incident radiation. In the dual band detector, the IR filter is disposed between an upper UV detector and a lower IR detector, as shown in FIG. 1.

As is also known in the art, one method used to produce the hexagonal Cadmium Sulfide (CdS) material for IR polarizers, for example, has been to use germanium as a substrate and epitaxially grow a relatively thick layer of CdS on the <111> surface of the germanium substrate, as described a paper entitled "Epitaxial Growth of cadmium Sulfide on (111) on germanium (Ge) substrates": by Paroici et al, in Journal of Material Science, 10 (1975) pages 2117-2123. The formed CdS material grows outwardly perpendicular to the <111> crystallographic plane of the Ge substrate; that is, the c-axis of the grown CdS is perpendicular the <111> surfaces of both the Ge and the grown CdS. The formed CdS is then used as infrared polarizer by positioning the hexagonal crystal c-axis of the formed CdS perpendicular to the Infrared (IR) light to be polarized; see Epitaxial growth of cadmium sulphide on (111) germanium substrates; C. PAORICI, C. PELOSI, G. BOLZON I, G. ZUCCALLI Laboratorio MASPEC-CNR, 43100 Parma, Italy; JOURNAL OF MATERIALS SCIENCE 10 (1975) 2117-2123.

SUMMARY

The inventors have recognized that in order to use the UV radiation detector layer as a UV detector the UV light must be injected parallel to the c-axis and that a new method of epitaxially producing such UV radiation detector layer with proper c-axis orientation relative to the direction of the injected UV light to be detected was required.

In accordance with the present disclosure, a radiation detector for detecting ultraviolet energy is provided. The radiation detector includes: a single crystal UV radiation detector material; and an amorphous support layer disposed directly on the single crystal UV radiation detector material with the single crystal UV radiation detector material having a c-axis aligned along a direction of the ultraviolet energy being detected.

In one embodiment, the amorphous support layer is silicon carbide.

In one embodiment, a Schottky contact metal is provided in Schottky contact with a single crystal UV radiation detector material.

In one embodiment, the single crystal UV radiation detector material is disposed between the amorphous support layer and the Schottky contact metal.

In one embodiment, the amorphous support layer is transparent to infrared radiation, In one embodiment, a method is provided for forming an UV light detector, comprising: providing a single crystal seed layer having a <111> crystallographic surface; forming an amorphous support layer having a supporting surface perpendicular to the <111> surface; depositing a UV radiation detecting material on both the <111> crystallographic surface of the seed layer and on a portion of the supporting surface adjacent to the single crystal seed layer; and converting the deposited UV radiation detecting material into single crystal UV radiation detecting material with a c-axis thereof perpendicular to the <111> crystallographic axis of the single crystal seed layer.

In one embodiment, the amorphous support layer retards formation of imperfections in the single crystal UV radiation detecting material on the amorphous support layer during the successively heating and cooling.

In one embodiment, a method is provided for forming an UV light detector, comprising: providing a single crystal seed layer having a <111> crystallographic surface; forming an amorphous support layer on a first portion of the <111> surface while exposing a second portion of the <111> surface, the amorphous support layer having a supporting surface perpendicular to the <111> surface; depositing a UV radiation detecting material on both the second portion of the <111> crystallographic surface of the seed layer and on a portion of the supporting surface adjacent to the a portion of the second portion of the single crystal seed layer, and successively heating and cooling the deposited UV radiation detecting material forming a single crystal layer of the UV radiation detecting material with such UV radiation detecting material being formed to extend outwardly from the second portion of the seed layer, the UV radiation detecting material being formed with a c-axis thereof perpendicular to the <111> crystallographic axis of the single crystal seed layer.

With such structure and method: 1) No bulk crystal growth required. More particularly the use of a bulk crystal is very, very time and process intensive. Cutting and polishing a crystal boule into the detector chips may require as many as 100 steps, any of which could result in a faulty chip or entire run of faulty chips. 2) Thin film CdS significantly improves UV detector performance as recombination noise is reduced. 3) Thin film CdS, as part of a layered IR transmission system, improves integrated IR filter/band pass throughput. 4) An IR transmission system layer acts as UV reflector increasing quantum efficiency of UV detector system.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIGS. 4A, 4B, and 4C through FIGS. 16A, 16B and 16C are cross sectional, top plan and bottom plan views, respectively of the UV radiation detector of FIGS. 2A, 2B and 2C at various steps in the fabrication of such UV radiation detector according to the disclosure.

Like reference symbols in the various drawings indicate like elements.

DETAILED DESCRIPTION

Figure 2:
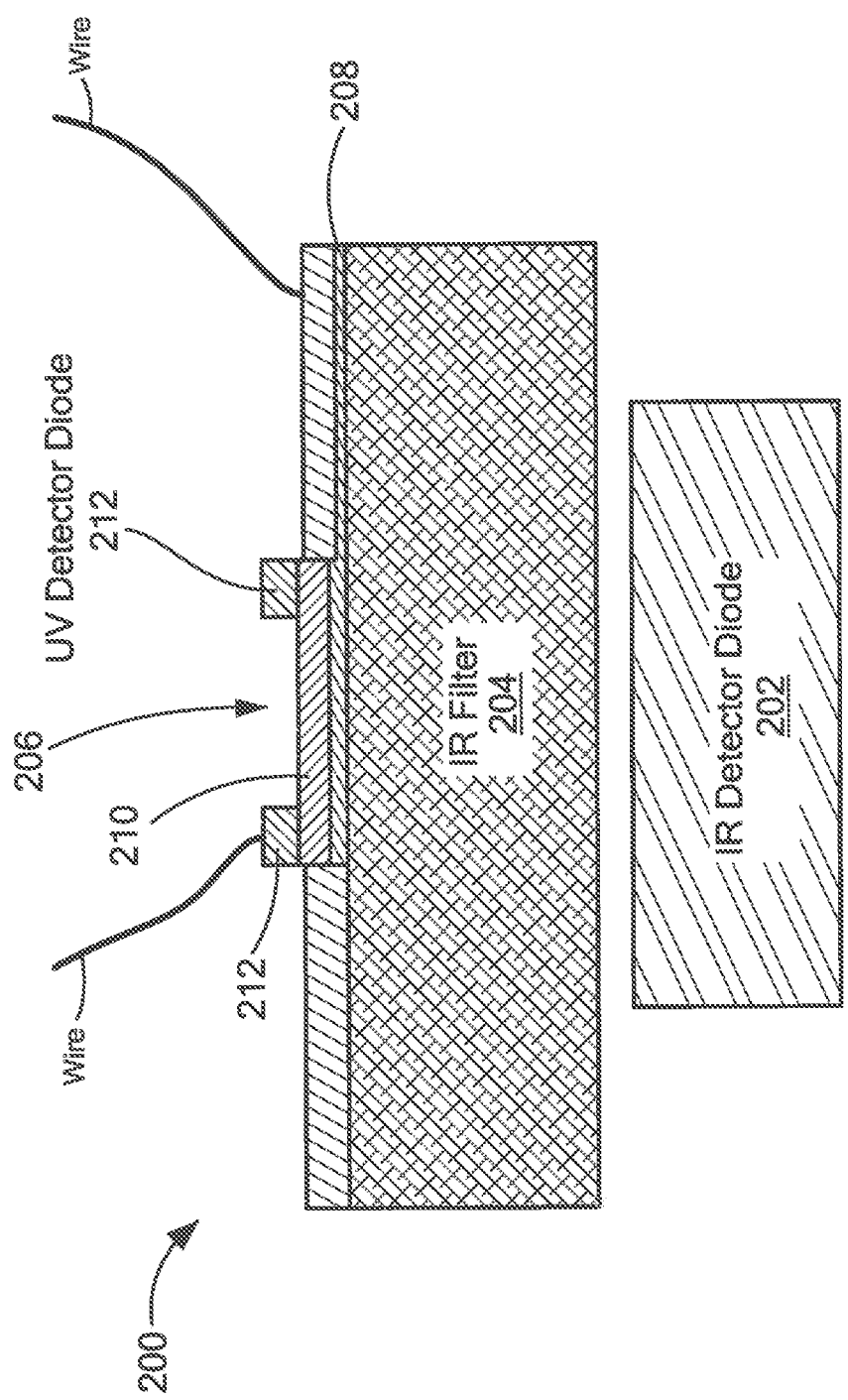
FIG. 2 is a simplified, diagrammatical sketch of a cross section of a dual band UV and Infrared (IR) radiation detector according to the disclosure.

Referring now to FIG. 2, a diagrammatical sketch of a dual band infrared and ultraviolet radiation detector 200 is shown having: an infrared (IR) radiation detector 202; an infrared radiation filter 204, disposed over infrared radiation detector 202, the infrared radiation filter 204 being transparent to infrared radiation band and absorptive to radiation adjacent to the infrared radiation band; and an ultraviolet (UV) radiation detector 206 disposed over the infrared filter 204. The ultraviolet radiation detector 206 includes: a Schottky contact metal layer 208 on an upper surface of the infrared radiation filter 204; layer 210 in this example, is the semiconductor, ultraviolet radiation detector material, here, in this example, Cadmium Sulfide (CdS) disposed directly on, and forming a Schottky contact with, the metal layer 208; and an ohmic contact metal 212 in ohmic contact with another portion of the CdS layer 210. It should be understood that the semiconductor, ultraviolet radiation detector material may be CdTe, CdTe, or CdSe, for example. Radiation in the ultraviolet is intercepted and detected by the ultraviolet radiation detector 206 while infrared radiation passing through the ultraviolet radiation detector 206 and through the infrared filter 204 is detected by the infrared detector 202. The details of the infrared (IR) radiation detector 202 and infrared radiation filter 204 will be described in more detail below and are indicated in FIGS. 2A, 2B and 2C as a UV detector 10.

More particularly, referring to FIGS. 3A, 3B and 3C, the UV detector 10 is shown in more detail and is fabricated in accordance with a process described below in connection with FIGS. 4A, 4B and 4C through FIGS. 16A, 16B and 16C. Here, an infrared IR Filter 12, here silicon, is used to also provide a substrate for formation of the detector 10. The detector 10 has an IR radiation anti-reflection coated glass layer 14, here IRG 23 having a thickness of approximately 0.35 microns, that also serves as a UV reflector, is supported by the IR Filter 12; a support structure, here for example, silicon carbide (SiC) layer 16, here approximately 40-100 Angstroms thick, is disposed on the glass layer 14; a semiconductor, UV radiation detector layer 18, for example CdS or Cadmium Selenide (CdSe), or Cadmium Telluride (CdTe), for example), here, in this example CdS layer 18 having a thickness in the order of 0.45 micron, disposed on the SiC layer 16; a Schottky contact metal 24, here platinum (Pt), here having a thickness in a range (5-50 nm), disposed on the a semiconductor, UV radiation detector layer 18, in Schottky contact with the semiconductor, UV radiation detector layer 18; an ohmic contact electrode 20, here a stack of Aluminum (Al)/Gold, in ohmic contact with the CdS layer 18; an Schottky contact electrode 28, here Titanium (Ti) with Au on top, the Ti being in electrically connected to the Schottky contact metal 24 and electrically insulated from the CdS layer 18 by a dielectric, $SiO_2$ layer 22. Also included are upper and lower IR blocking layers 26U, 26L, here a stack of titanium (Ti), gold, titanium; a surface protection and anti-reflection coating layer 27, here silicon dioxide approximately 0.72 microns thick on the Schottky contact metal 24; anti-reflection coating layer 32, here, for example, Titanium Oxide (TiO)/Aluminum Oxide ($Al_2O_3$)/Magnesium Fluoride (MgF), approximately, 0.45 microns thick, 0.5 microns thick, and 0.75 micros thick respectively. Dielectric passivation layers 30U, 30L, here silicon dioxide ($SiO_2$) approximately 0.5 microns thick are provided, as shown. An IR radiation anti-refection dielectric layer 27, here for example, silicon dioxide ($SiO_2$) approximately 0.72 microns thick is disposed on the Schottky contact metal 24. Also included is a dielectric layer 19, here silicon dioxide. Wires 32, 34 are connected to the ohmic contact electrode 20 and the Schottky contact electrode 28, respectively as shown. The index of refraction of the IR radiation anti-reflection dielectric layer 27 to IR radiation is less than the index of refraction of the semiconductor, UV radiation detector layer 18 to IR radiation; the index of refraction of the semiconductor, UV radiation detector layer 18 to IR radiation is less than the index of refraction of the glass layer 14 to IR radiation; and the index of refraction of glass layer 14 to IR radiation is less than the index of refraction of the an infrared IR Filter 12. (It should be noted that SiC layer 16 is very thin, less than 40 nm and the refractive index of SiC is very close to that of the glass layer 14 layer so if the thickness had to be larger one could compensate by making the glass layer thinner.

Figure 1:
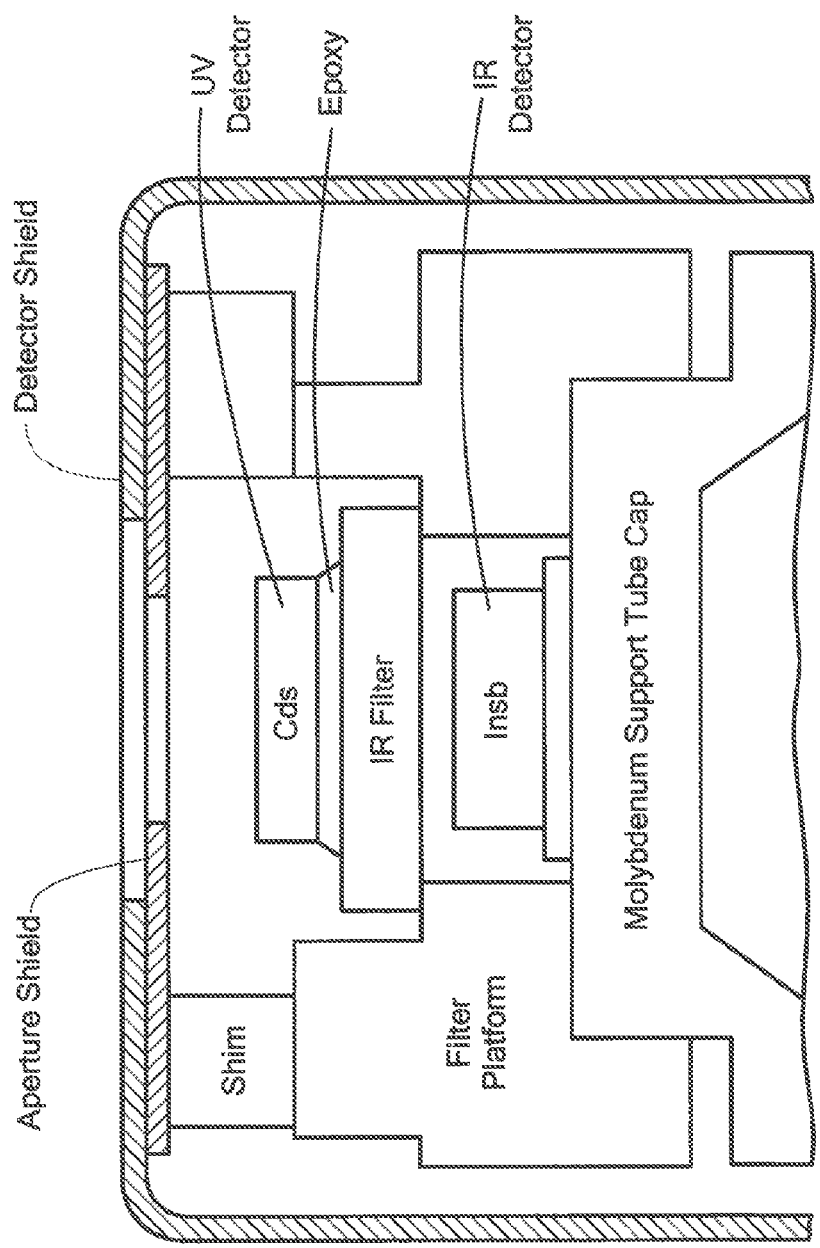
FIG. 1 is a diagrammatical sketch of a cross section of a dual band UV and Infrared (IR) radiation detector according to the PRIOR ART.

Thus, incident radiation passes onto the upper, surface of the structure with the UV portion of the radiation being detected by the UV detector 10 and the IR radiation passing out of the central portion of the structure to the infrared radiation detector 202 (FIG. 1)

Figure 4A:
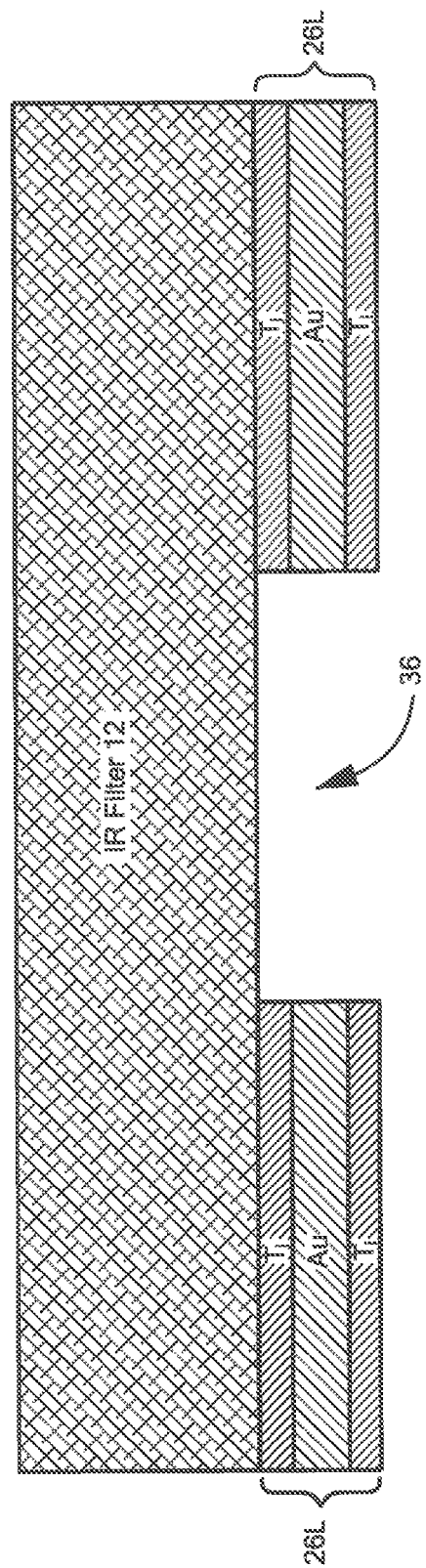
Figure 4C:
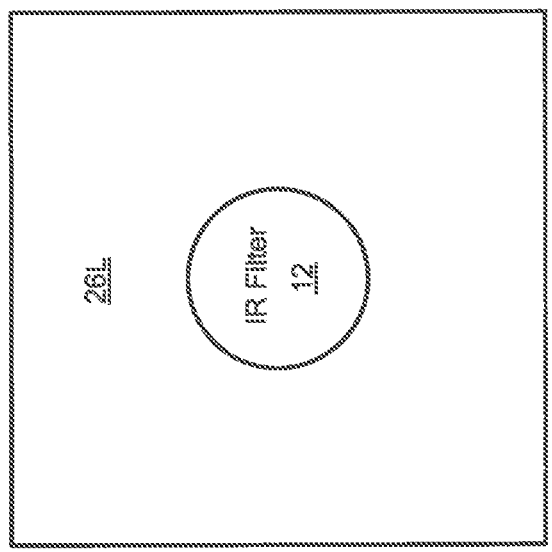
Figure 4B:
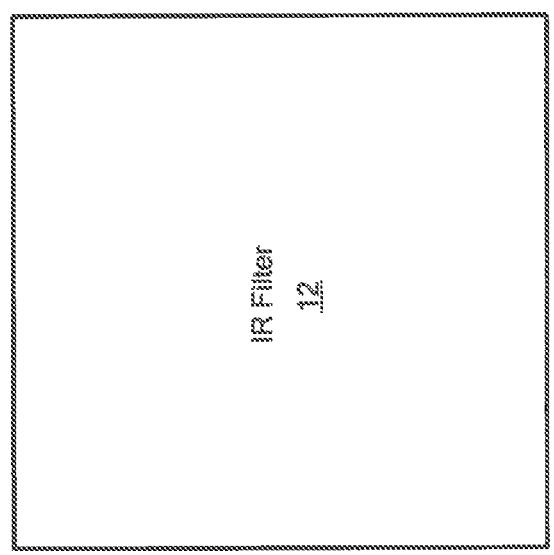

Referring now to FIGS. 4A, 4B and 4C, the top and bottom surfaces of the silicon IR Filter 12 is prepared by mechanical polishing and passivation, here for example by immersion in a $HF/NH_4F$ bath. The bottom surface of the an infrared (IR) filter 12, here for example, a single crystal substrate, here for example, silicon, has formed, using any conventional photolithographic-etching process, on the bottom surface thereof the lower IR blocking layer 26L, here of a stack of titanium (Ti)/gold (Au)/Ti with a central, aperture 36 therein exposing a central, bottom surface portion of the IR filter 12, as shown.

Next, the dielectric layer 30L, here silicon dioxide ($SiO_2$) is formed over the lower IR blocking layer 26L and onto the portion of the silicon IR Filter 12 exposed by the aperture 36.

Figure 5A:
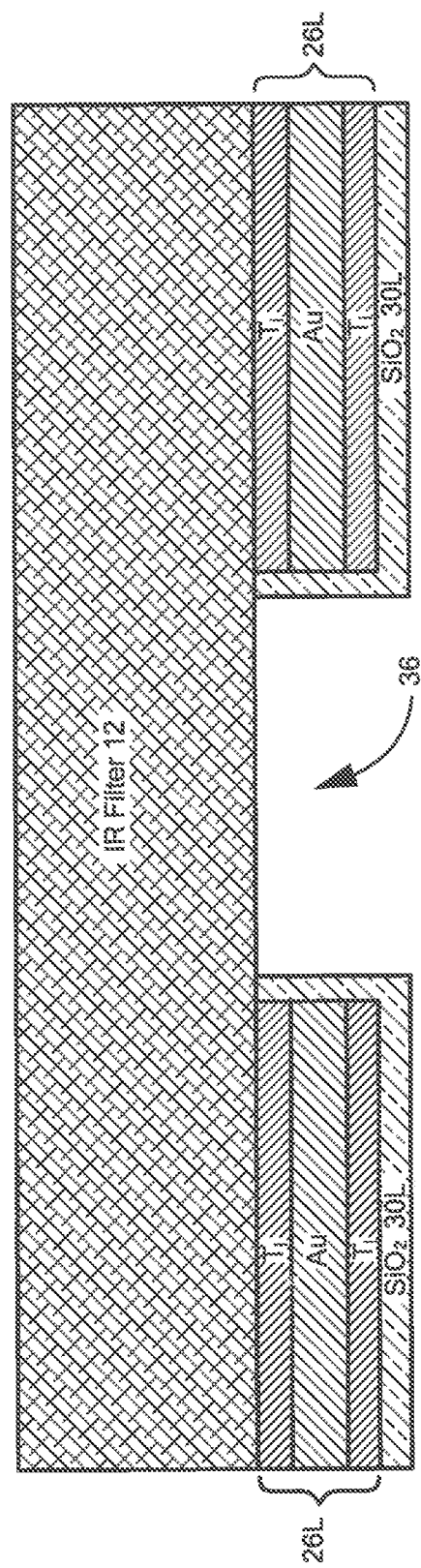
Figure 5C:
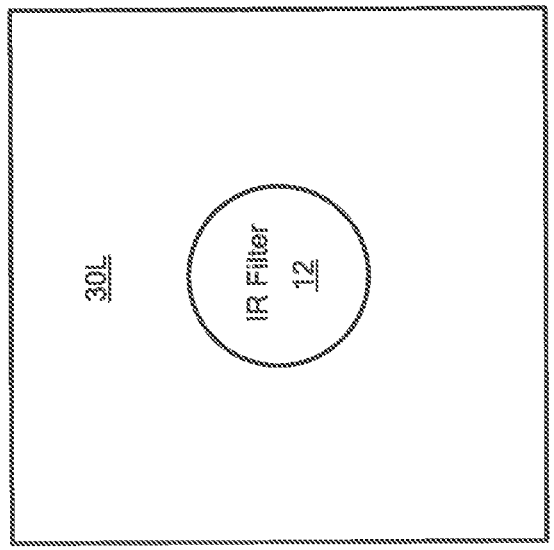
Figure 5B:
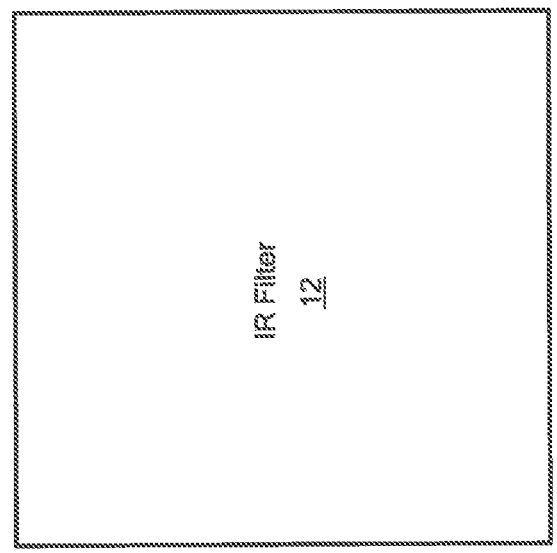

Next, the portion of the dielectric layer 30L on the exposed, central portion of the IR filter 12 is removed using any conventional photolithographic-etching process thereby re-exposing the central portion of the bottom of the IR Filter 12 with aperture 36, as shown in FIGS. 5A, 5B and 5C.

Figure 6A:
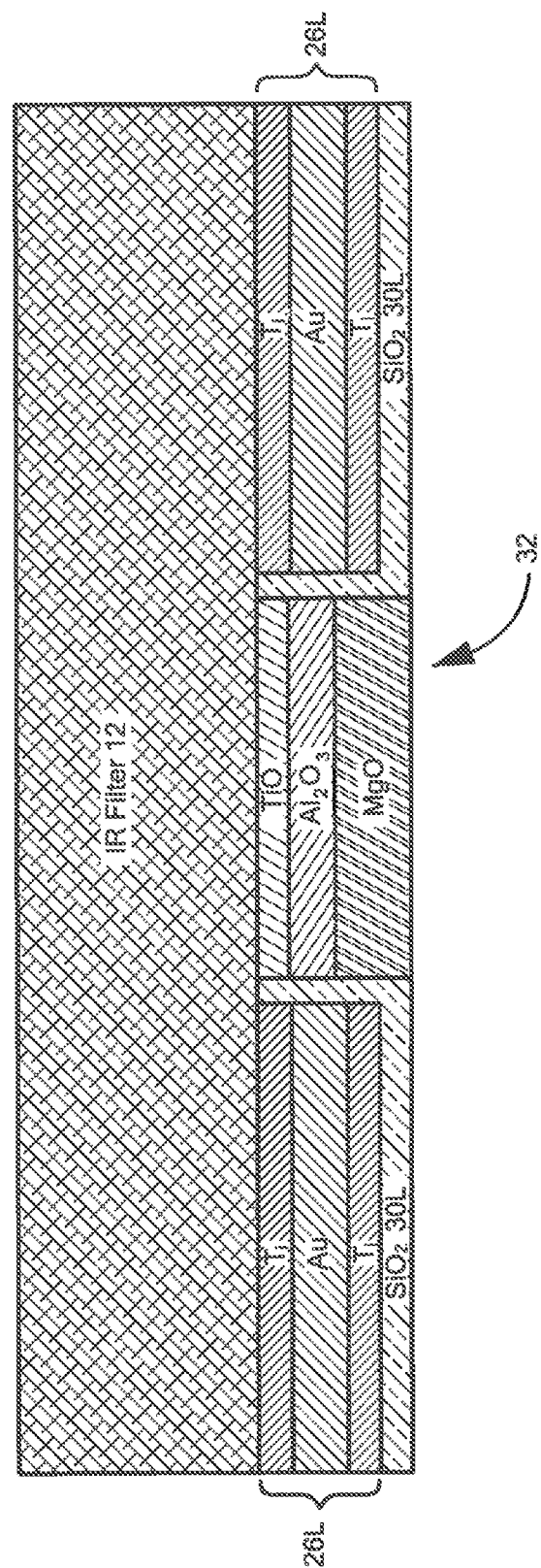
Figure 6C:
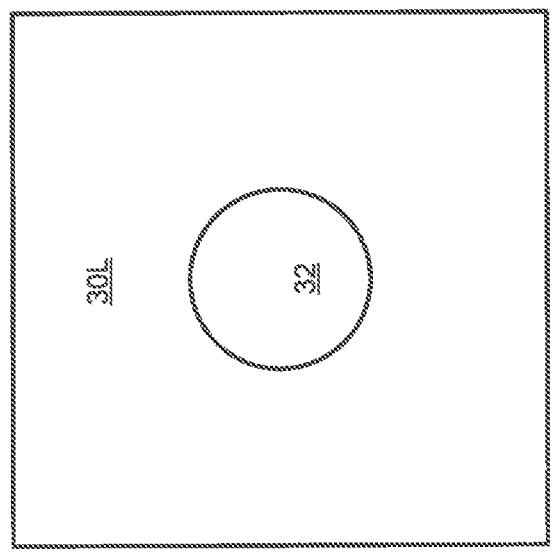
Figure 6B:
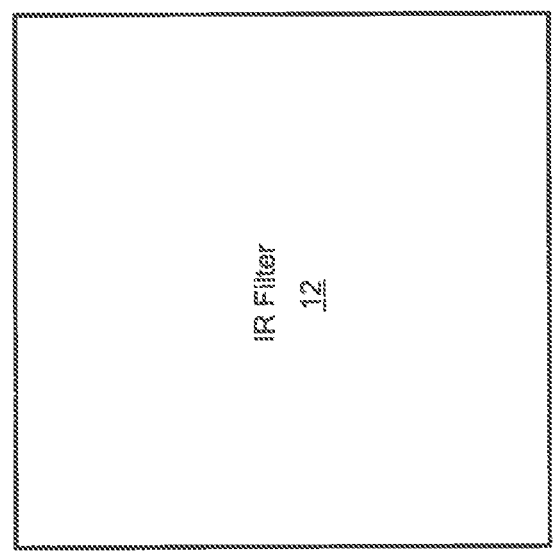

Next, a sequence of three layers of TiO, Al$_2$O$_3$ and MgF making up IR anti-reflection layer 32 (FIGS. 6A, 6B, 6C) is formed: first a layer of Titanium Oxide (TiO); then a layer of aluminum oxide (Al$_2$O$_3$); then a layer of Magnesium Fluoride (MgF) are deposited over the structure; such sequence of layers being deposited onto the re-exposed portion of the central, bottom of the IR Filter 12 and over the remaining dielectric layer 30L. Conventional photolithographic-etching processing is used to remove the portions of the three layers making up layer 28 disposed over the remaining dielectric layer 30L leaving only the portion of the three layers making up layer 28 disposed on the central portion of the IR Filter 12, as shown in FIGS. 6A, 6B and 6C thereby completing processing of the bottom of the IR Filter 10.

Figure 7C:
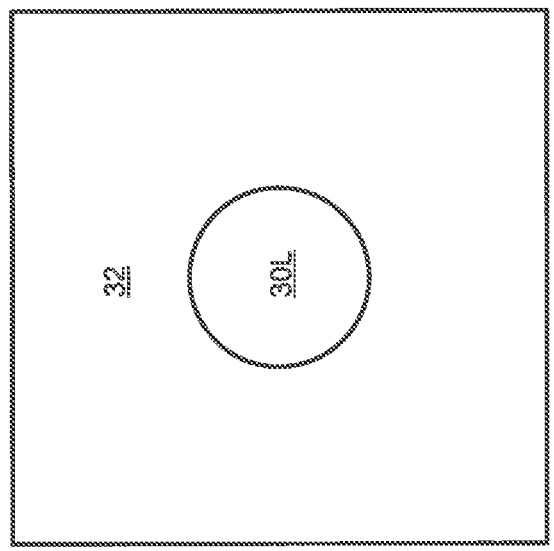
Figure 7B:
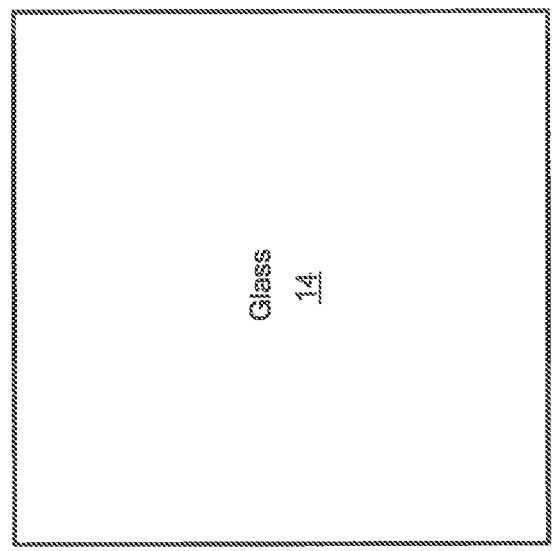

Next, referring to FIGS. 7A, 7B and 7C the anti-reflection layer of glass 14, here IRG 23 glass having a thickness in this example, of approximately 0.35 microns, is formed using conventional chemical vapor deposition directly on the portion of the upper, central surface portion of the IR Filter 12.

Figure 8A:
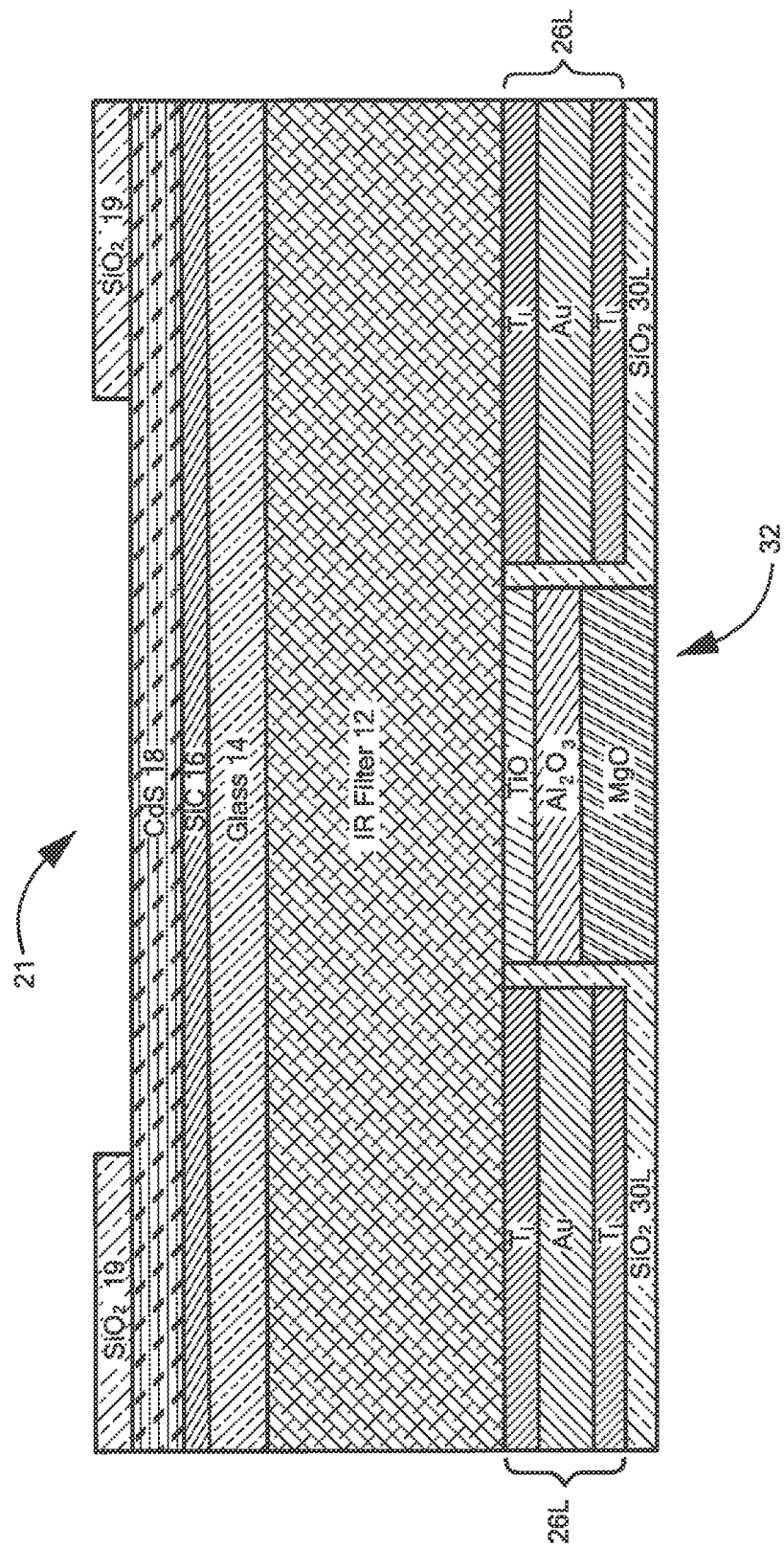
Figure 8C:
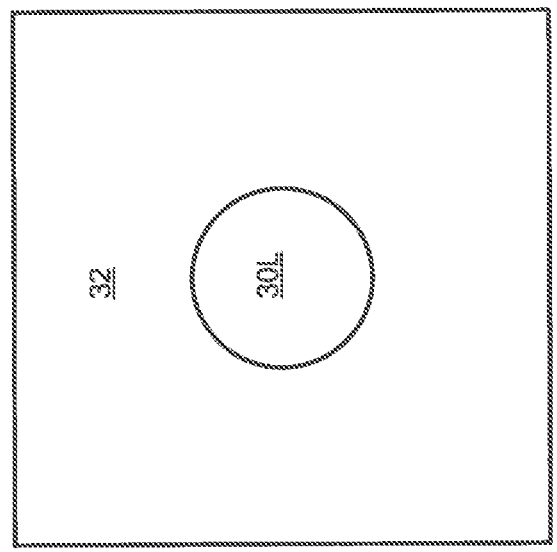
Figure 8B:
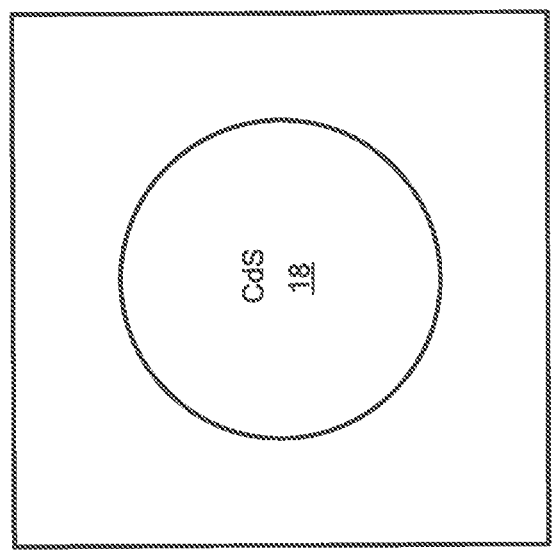

Next, referring to FIGS. 8A, 8B and 8C, SiC layer 16 with the UV radiation detector layer 18 thereon are formed on the glass layer 14 in a manner to be described in connection with FIGS. 18A-25. Next, dielectric layer 19, here silicon dioxide, is formed over the UV radiation detector layer 18 and patterned as shown using conventional photolithographic-etching processing to have an aperture 21 in a central portion of the surface passivation layer to expose the central portion of the semiconductor, UV radiation detector layer 18, as shown.

Figure 9A:
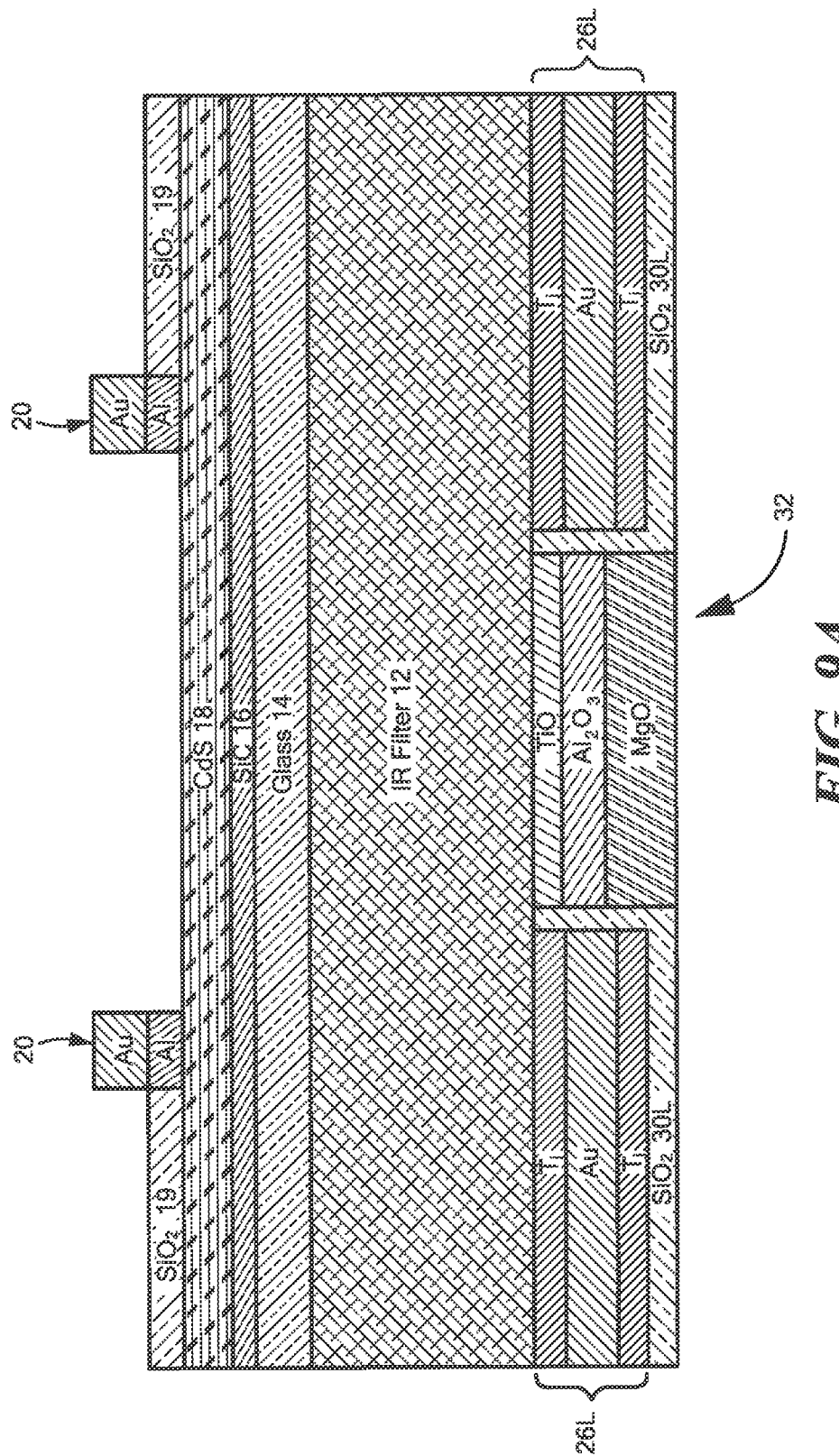
Figure 9C:
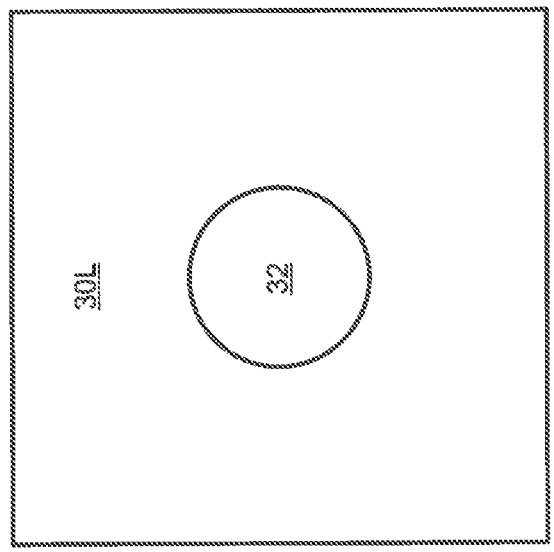
Figure 9B:
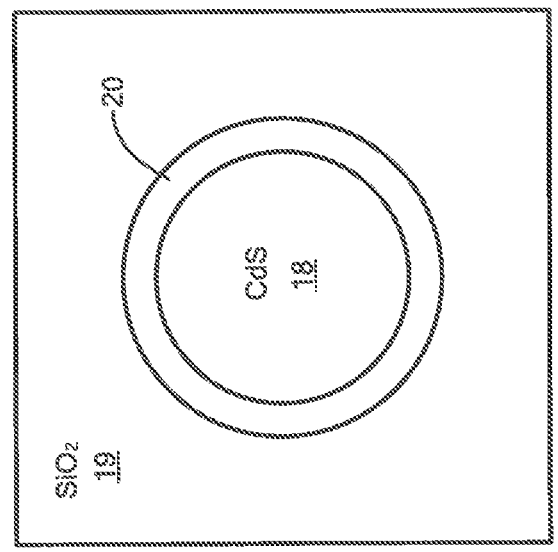

Next, referring to FIGS. 9A-9C, a layer of aluminum followed by a layer of gold are deposited over the patterned passivation layer and onto a portion of the exposed semiconductor, UV radiation detector layer 18 and patterned as shown using conventional photolithograph-etching techniques to form ohmic contact electrode 20, described above, to the semiconductor, UV radiation detector layer 18.

Figure 10A:
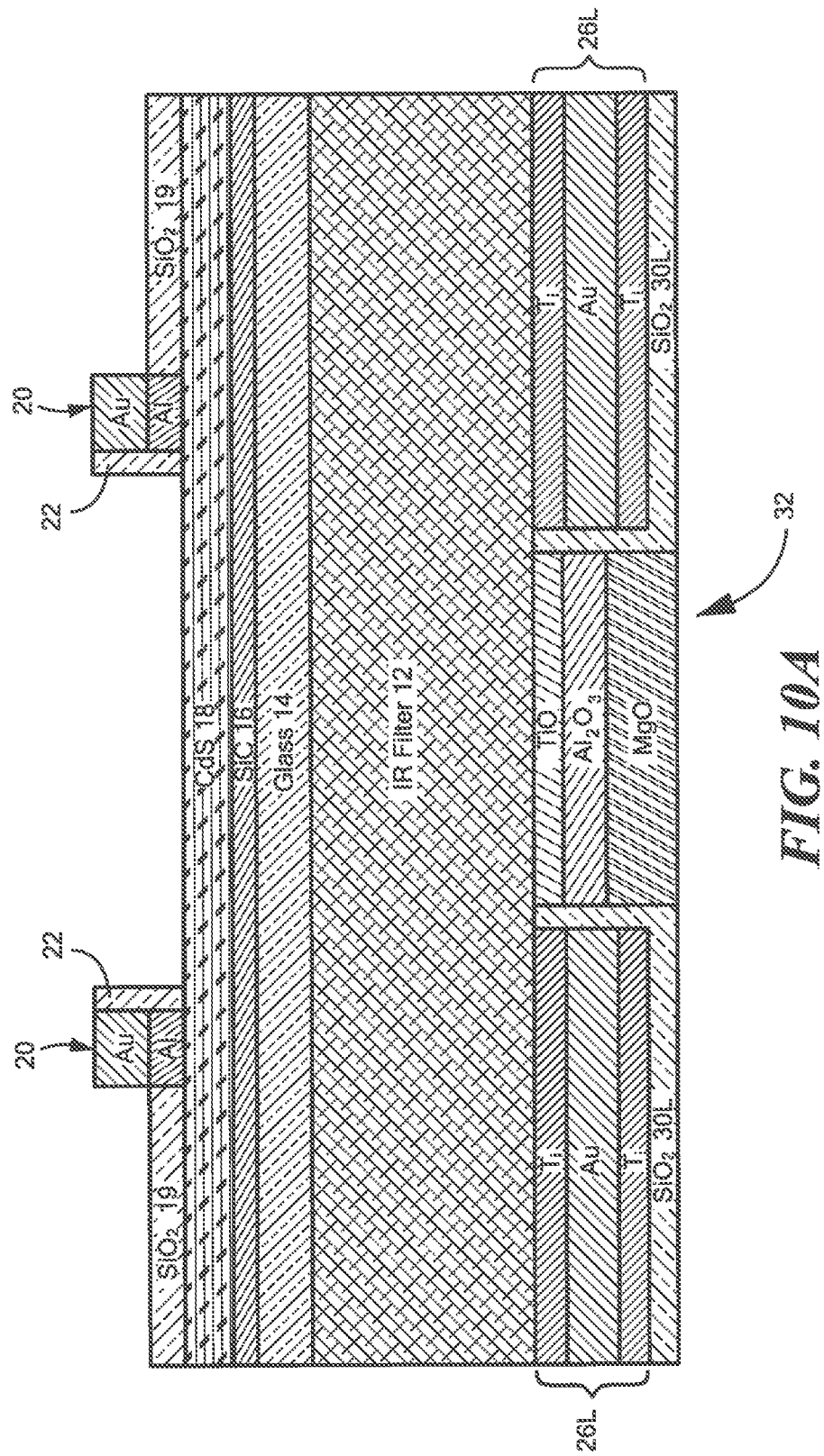
Figure 10C:
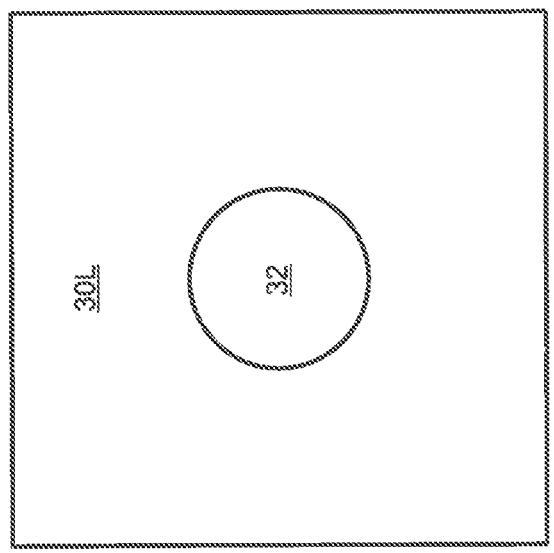
Figure 10B:
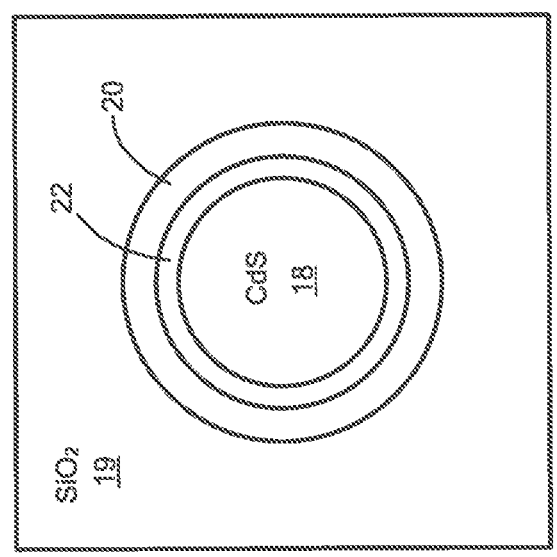

Next, referring to FIGS. 10A, 10B and 10C, the dielectric layer spacers 22 are formed over the upper surface of then structure as shown using conventional photolithographic-etching, as shown.

Figure 11A:
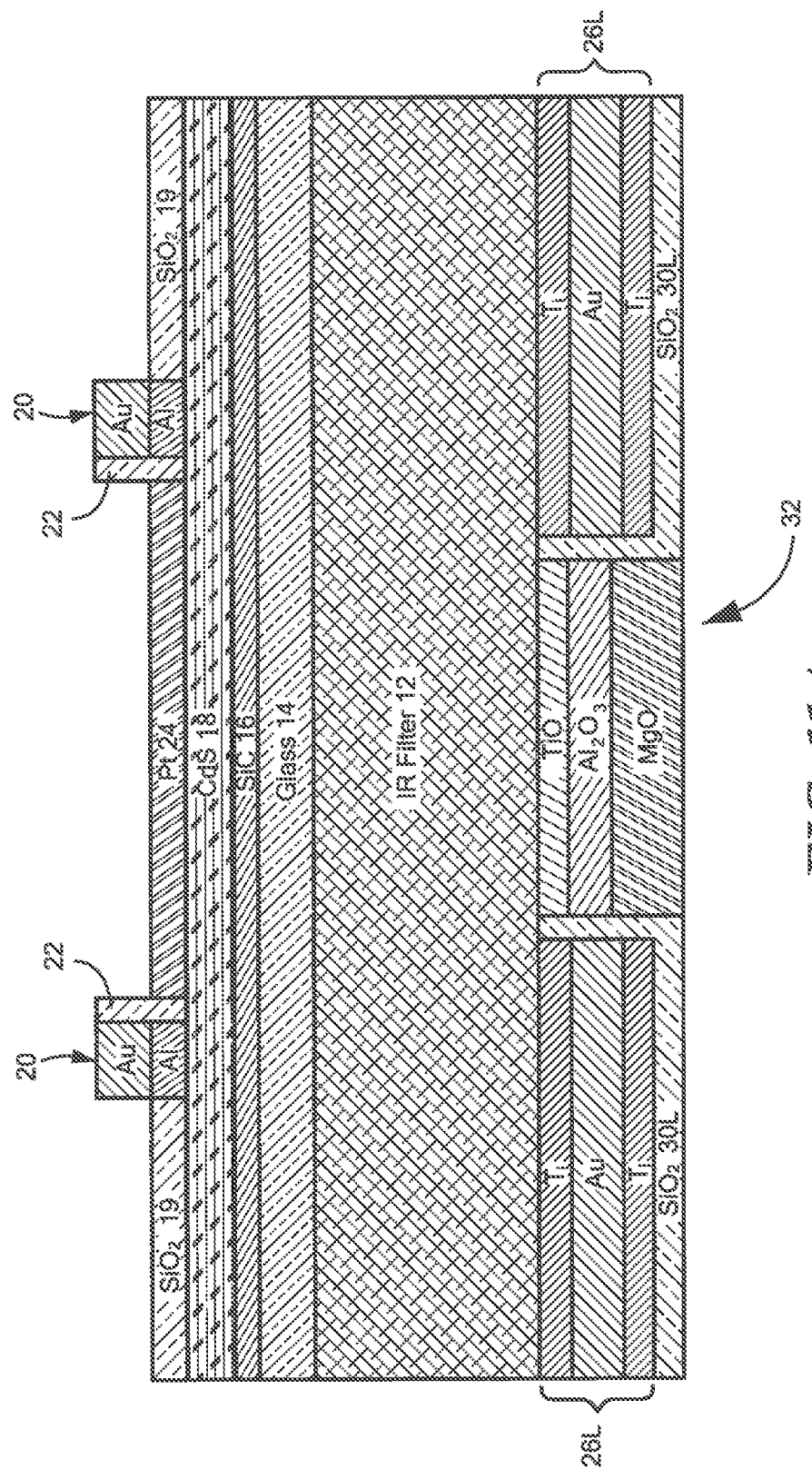
Figure 11C:
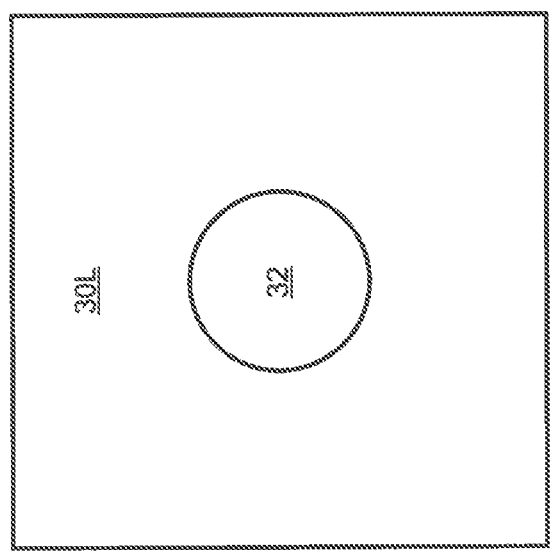
Figure 11B:
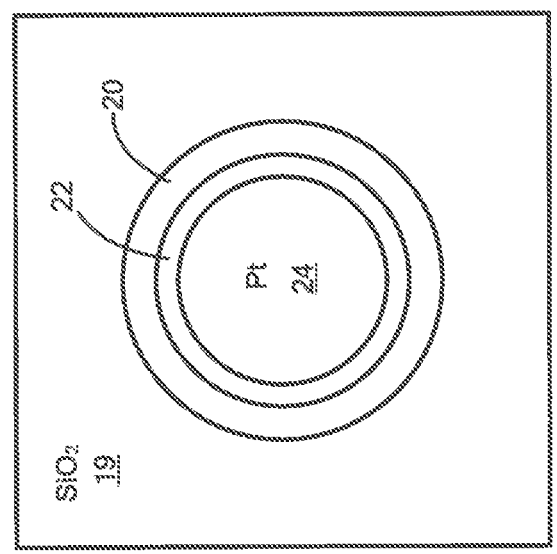

Next, referring to FIGS. 11A, 11B and 11C, the layer of the Schottky contact metal 24, here platinum (or other suitable metals or alloys) having a thickness in the example, approximately 5 to 50 nm, preferably 15 nm), is deposited over the surface of the structure, patterned as shown using conventional photolithographic-etching techniques and processing to form a Schottky contact with the semiconductor, UV radiation detector layer 18, as shown.

Figure 12A:
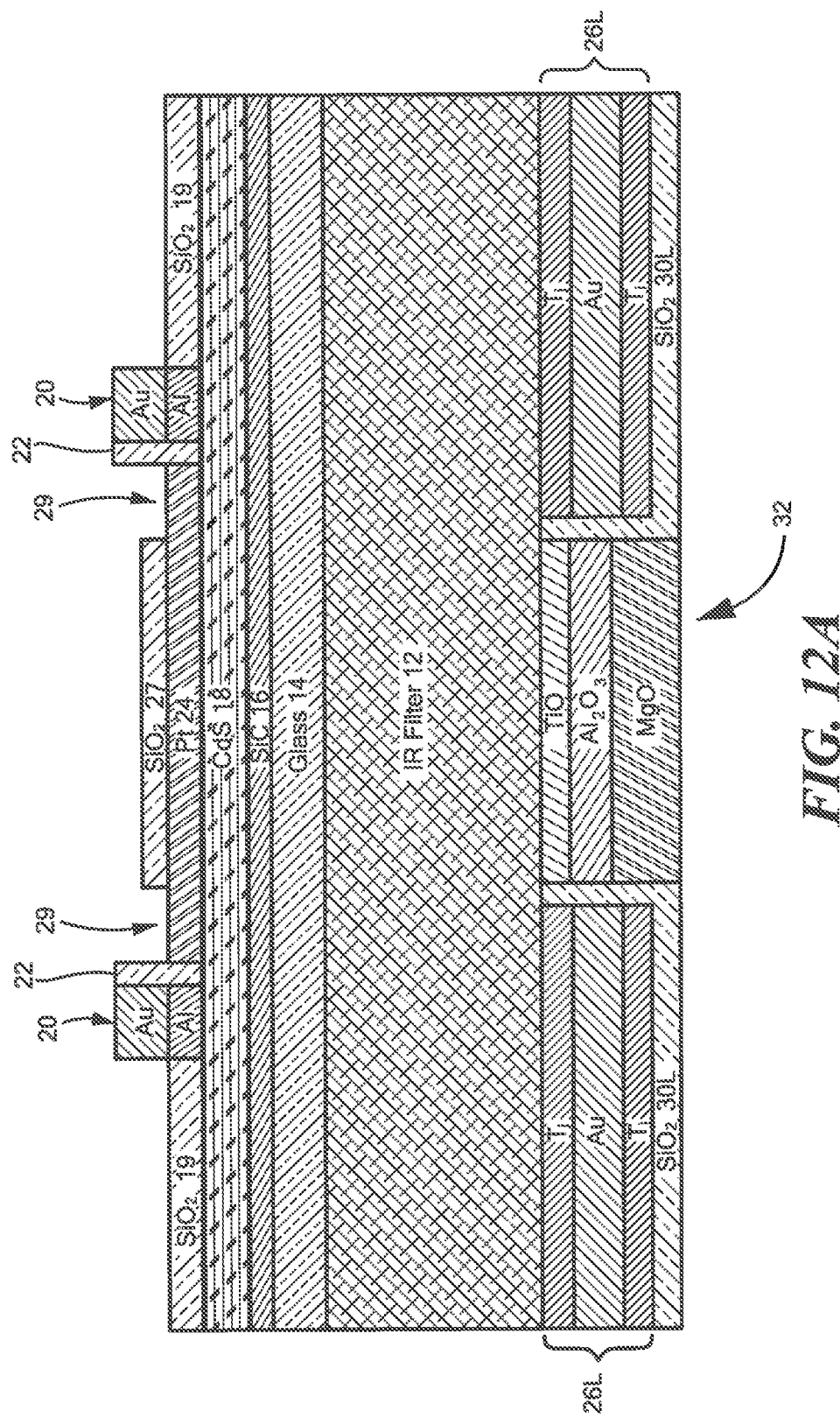
Figure 12C:
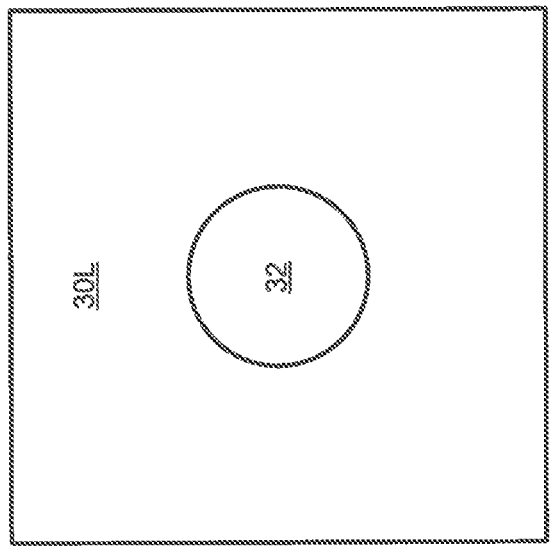
Figure 12B:
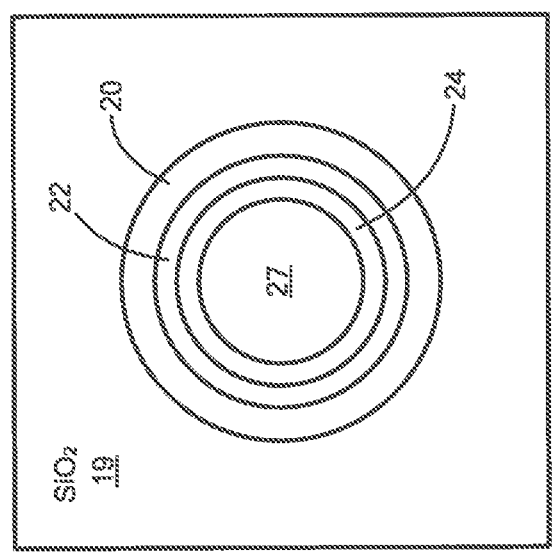

Next, referring to FIGS. 12A, 12B and 12C, a circular, disk-shaped dielectric layer 27, here silicon dioxide is deposited over the Schottky contact metal 24, and patterned as shown using conventional photolithographic-etching techniques to form a surface protection and anti-reflection coating layer, it is noted that a circular ring-shaped window 29 is formed in layer 27 to expose a circular ring-shaped portion of the Schottky contact metal 24.

Figure 13A:
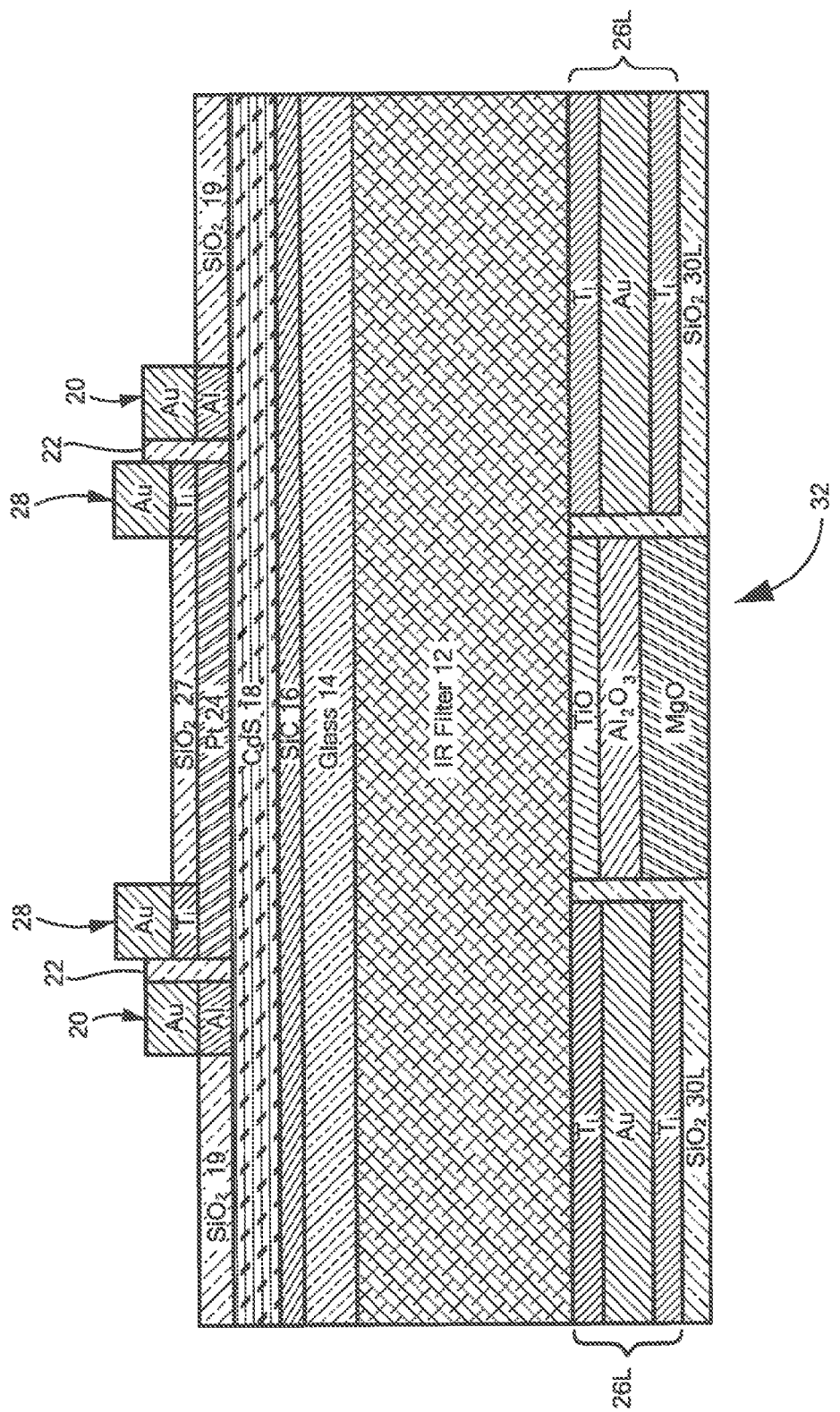
Figure 13C:
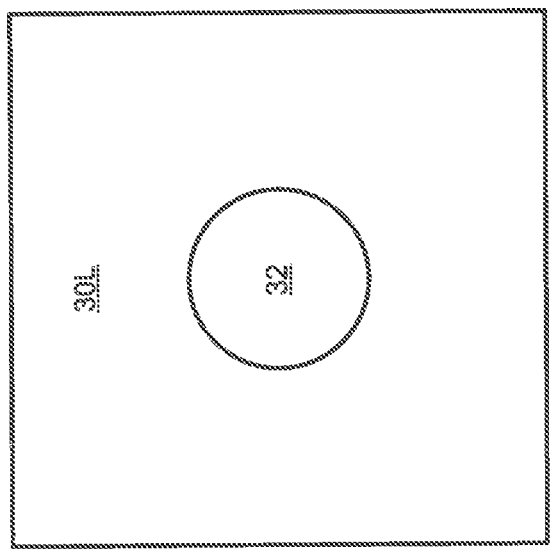
Figure 13B:
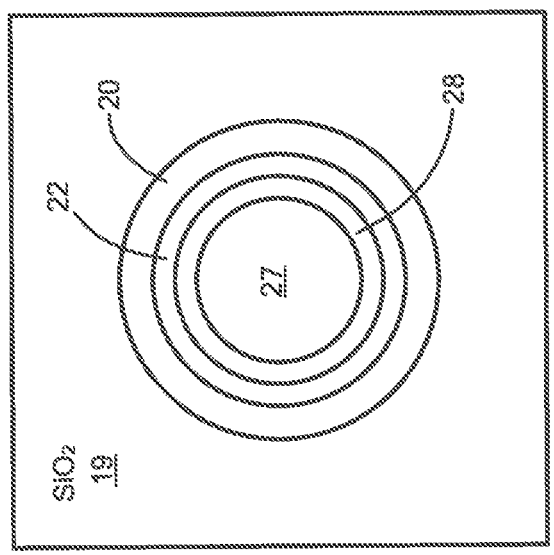

Next, referring to FIGS. 13A, 13B and 13C, the Schottky contact electrode 28 is formed in Schottky contact with the exposed circular ring-shaped portion 29 (FIGS. 12A, 12B and 12C) of the Schottky contact metal 24 using conventional deposition-photolithographic-etching processing.

Figure 14A:
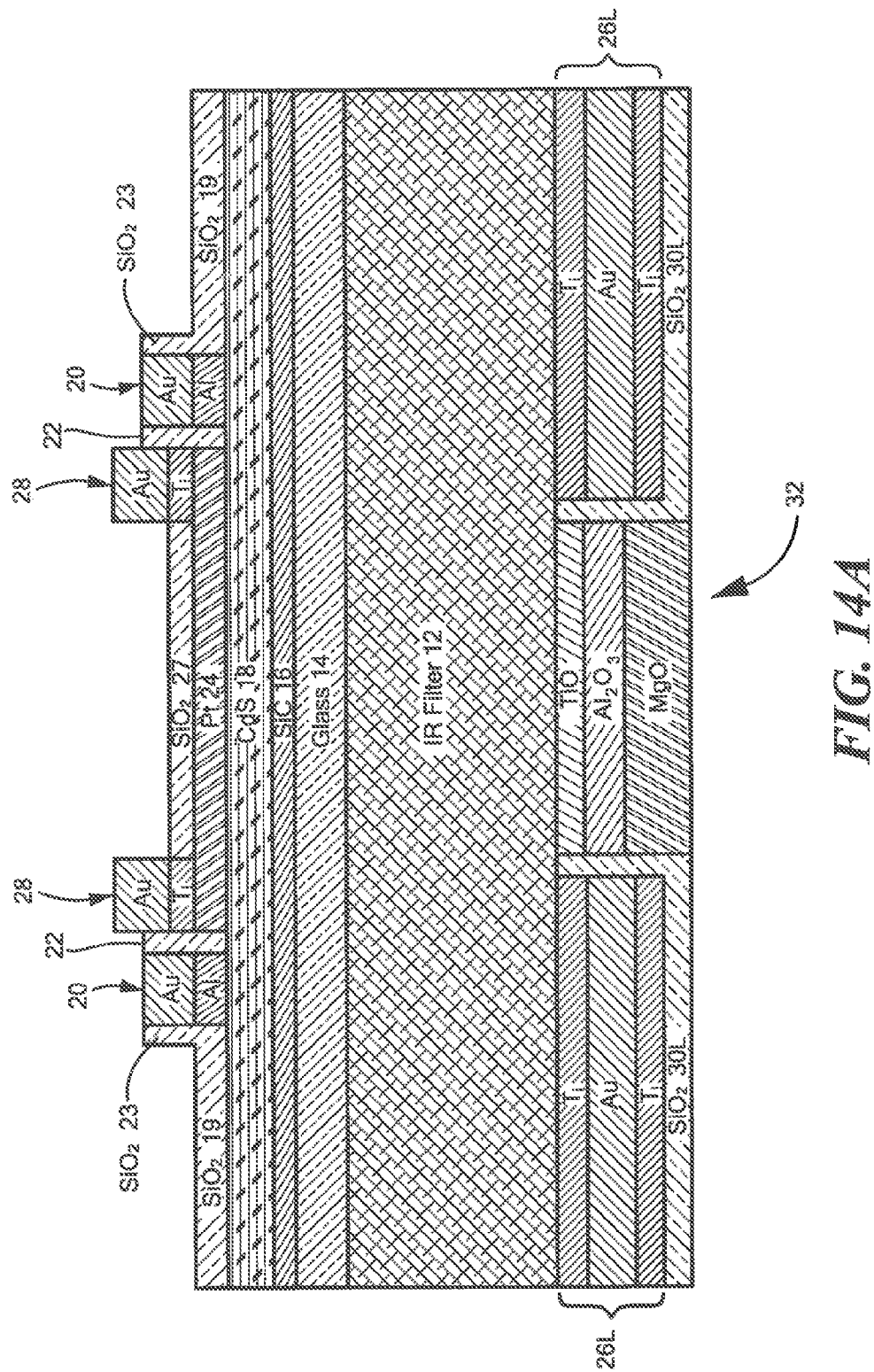
Figure 14C:
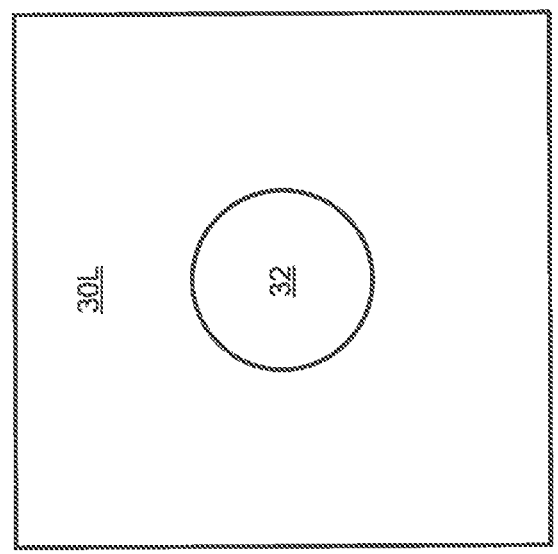
Figure 14B:
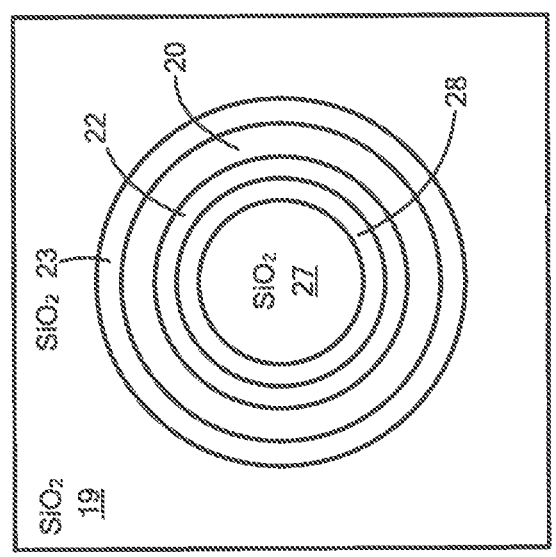

Next, referring to FIGS. 14A, 14B and 14C, the dielectric protection, ring-shaped layer 22 is formed, as shown, on inner portions of the layer 19, and on outer peripheral portions of ohmic contact electrode 20 using conventional deposition-photolithographic-etching processing.

Figure 15A:
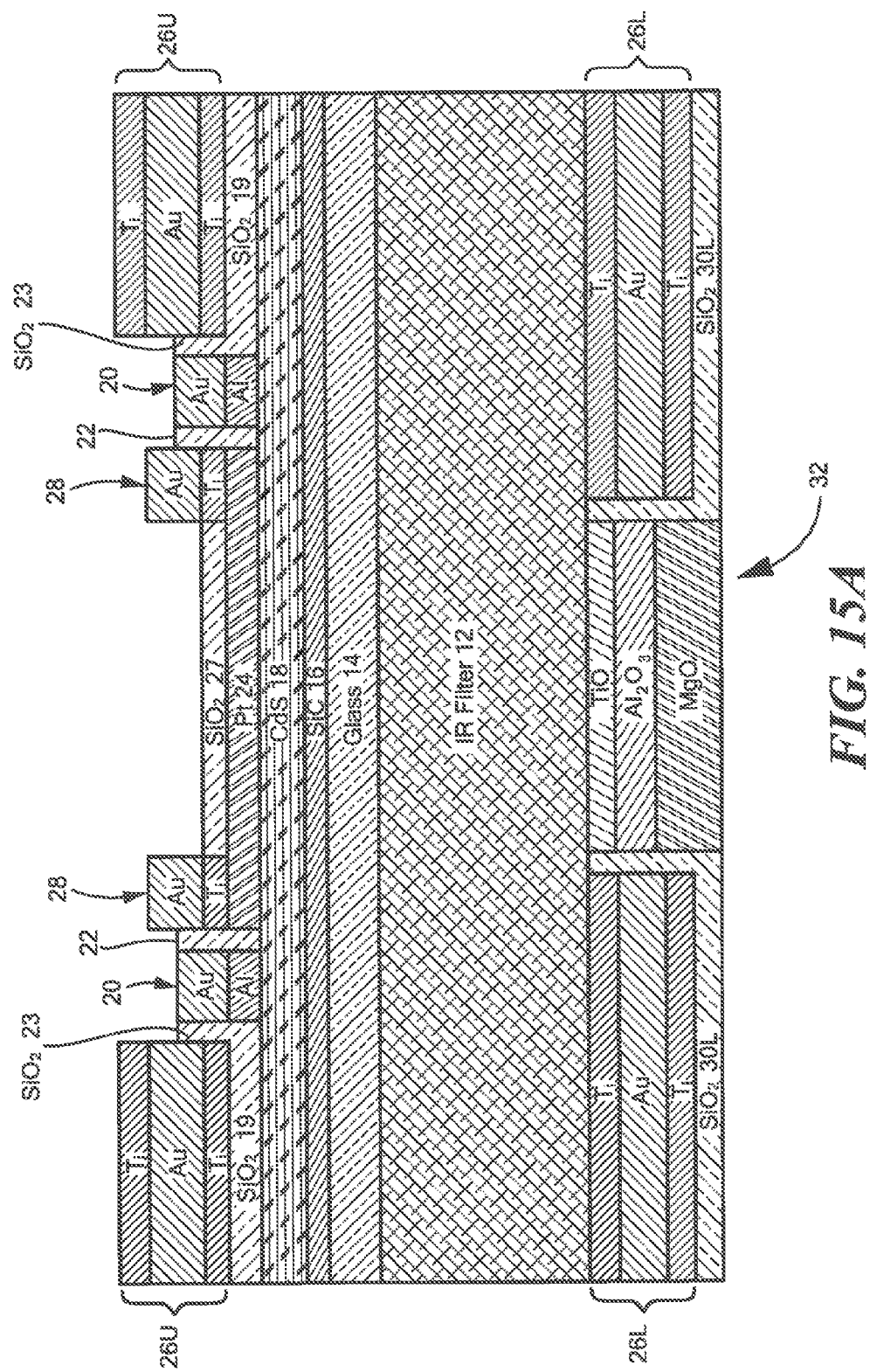
Figure 15B:
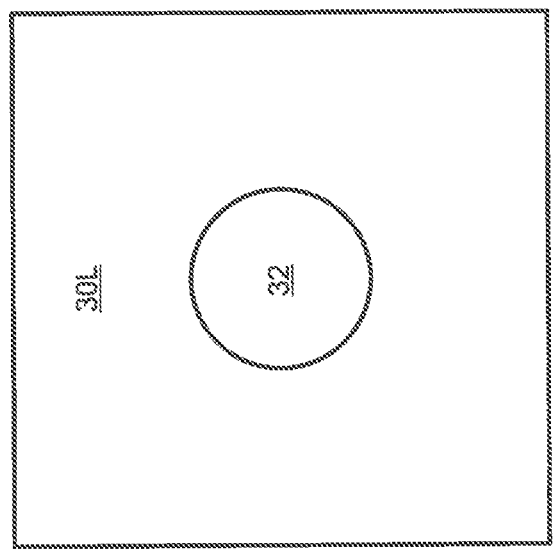
Figure 15C:
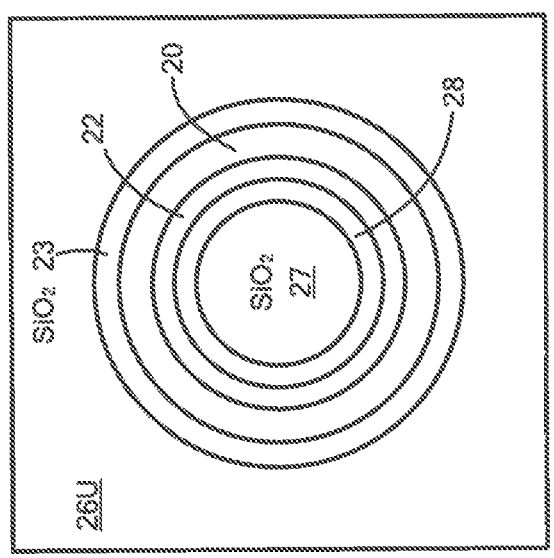

Next, referring to FIGS. 15A, 15B and 15C, the ring-shaped IR blocking layer 26U is formed using conventional deposition-photolithographic-etching processing, as shown.

Figure 16A:
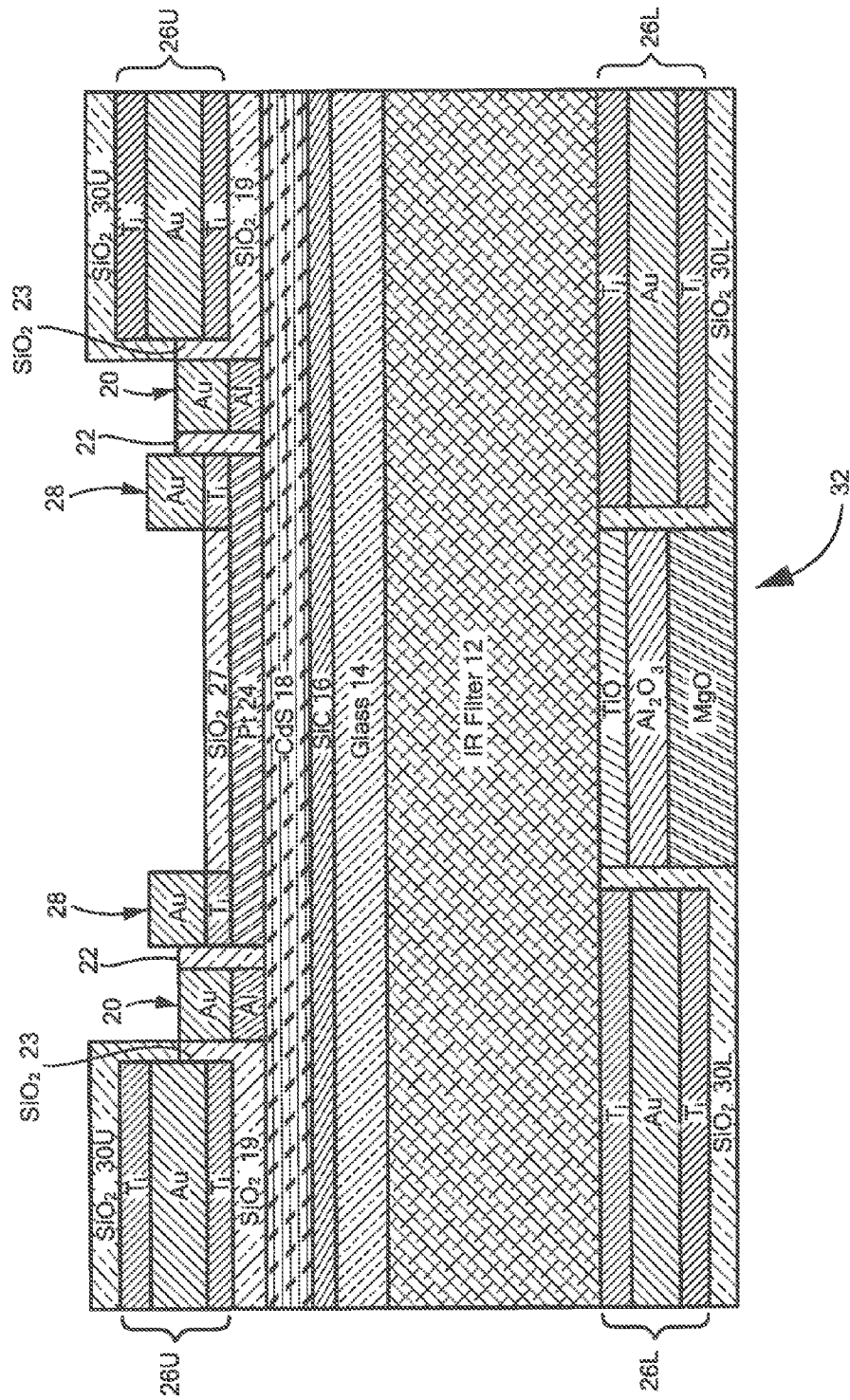
Figure 16C:
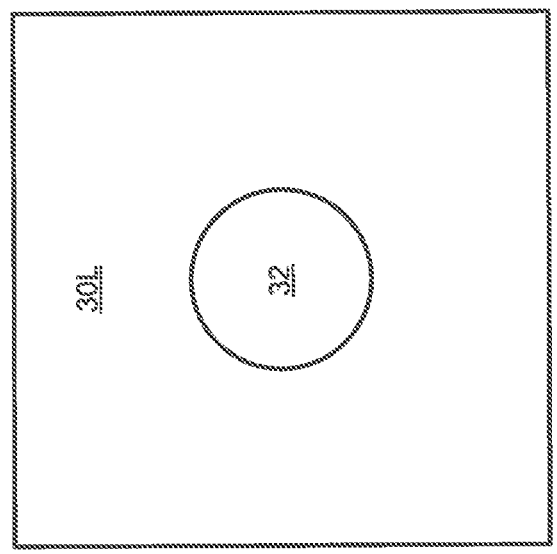
Figure 16B:
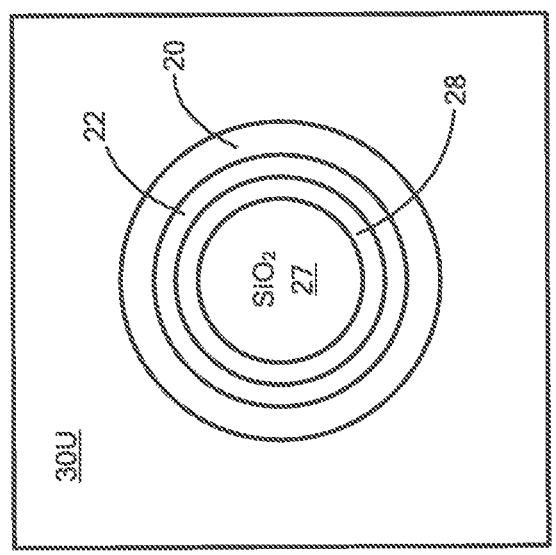
Figure 17A:
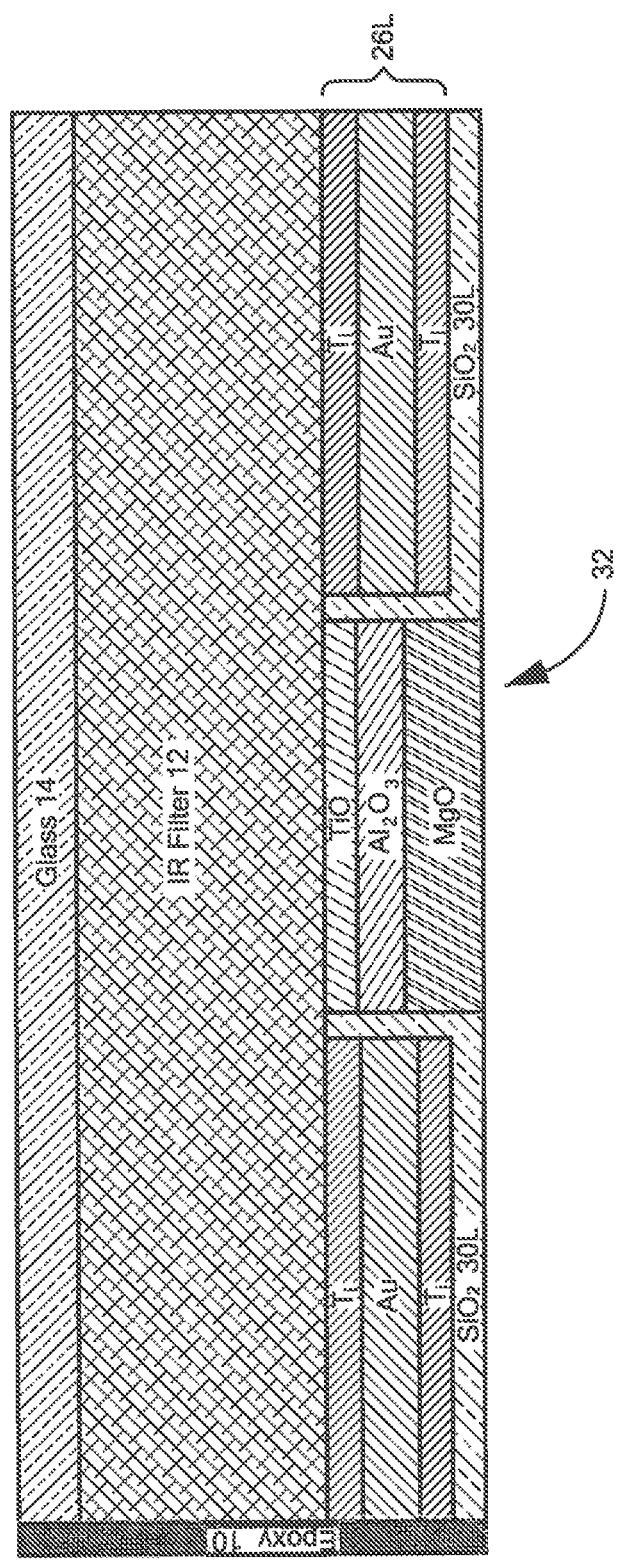
FIG. 17A through FIG. 24 are diagrammatical sketches useful in understanding the process for forming a semiconductor, UV radiation detector layer used in the. UV radiation detector of FIGS. 2A-2C at various stages in the fabrication thereof according to the disclosure; with FIGS. 19 and 21 showing diagrammatically apparatus used such fabrication.
Figure 17C:
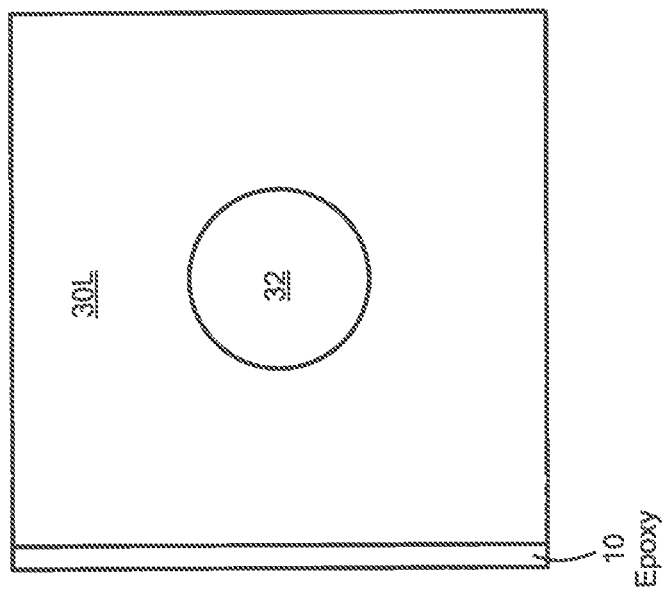
Figure 17B:
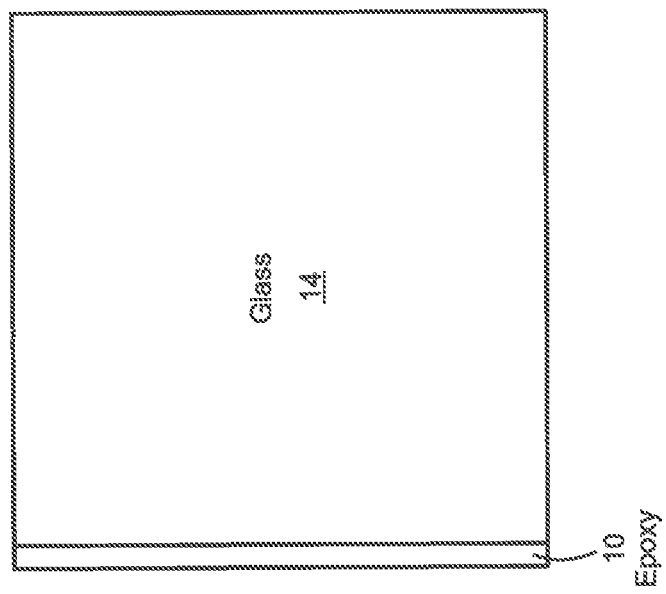

Next, referring to FIGS. 16A, 16B and 16, the surface passivation layer 30U is formed as shown using conventional deposition-photolithographic-etching processing.

Figure 3A:
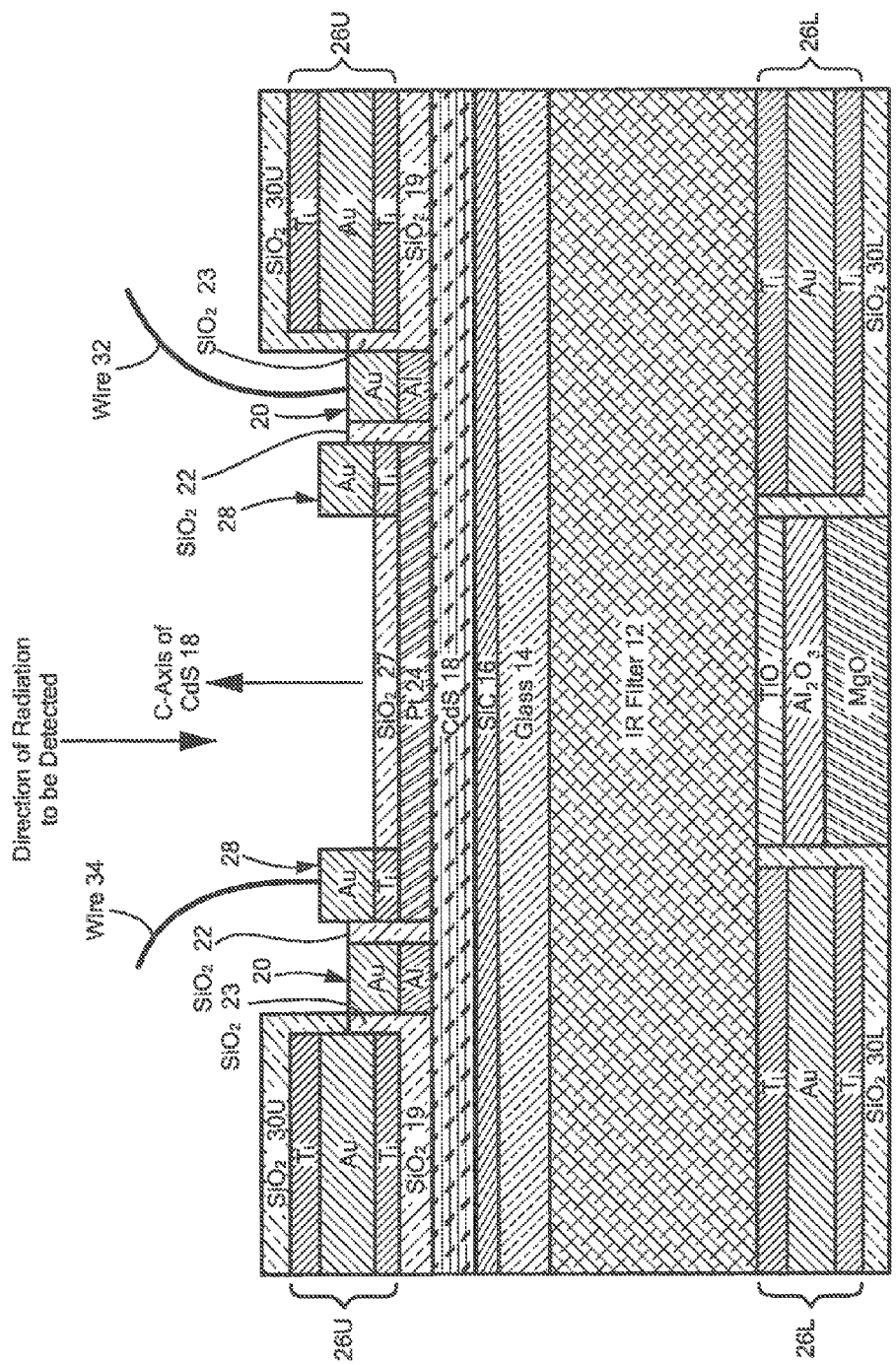
FIGS. 3A, 3B and 3C are more detailed, cross-sectional, top plan and bottom plan views, respectively, the cross section of FIG. 3A being taken along lines 3A-3A in FIGS. 3B and 2C, of a UV radiation detector adapted for use in a dual band Ultraviolet (UV) and Infrared (IR) radiation detector according to the disclosure.
Figure 3C:
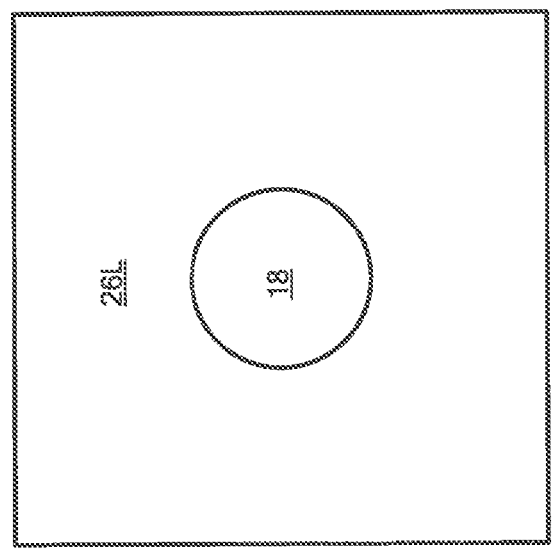
Figure 3B:
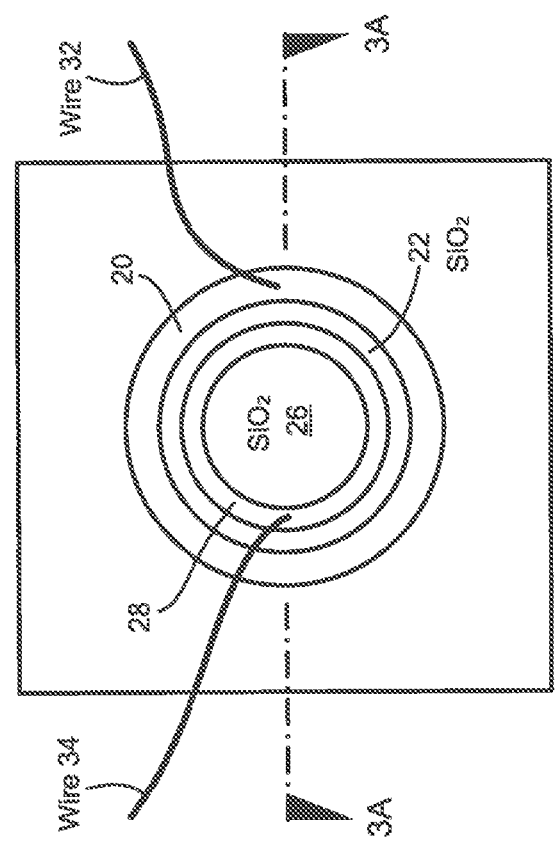
Figure 18A:
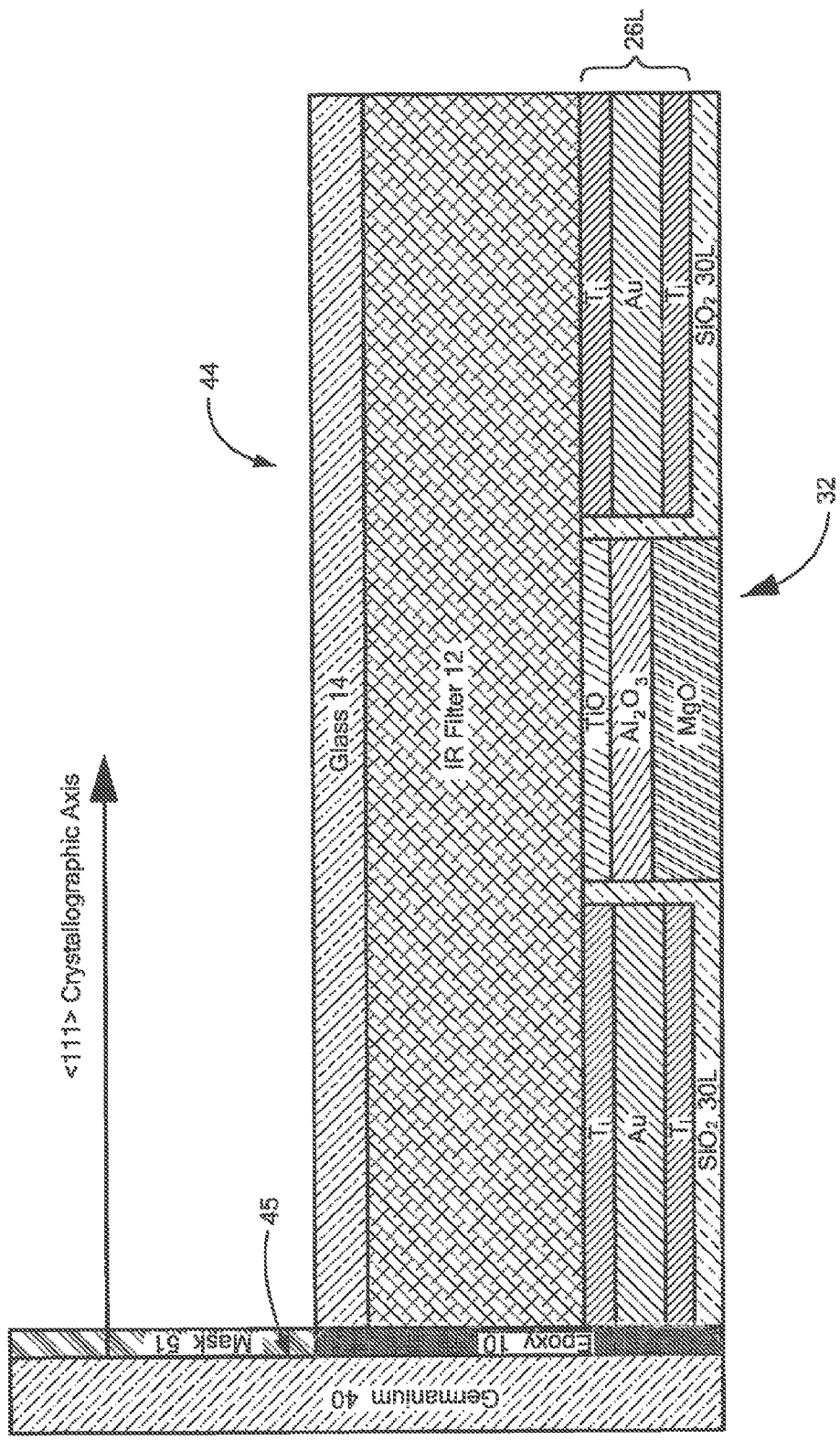
Figure 18C:
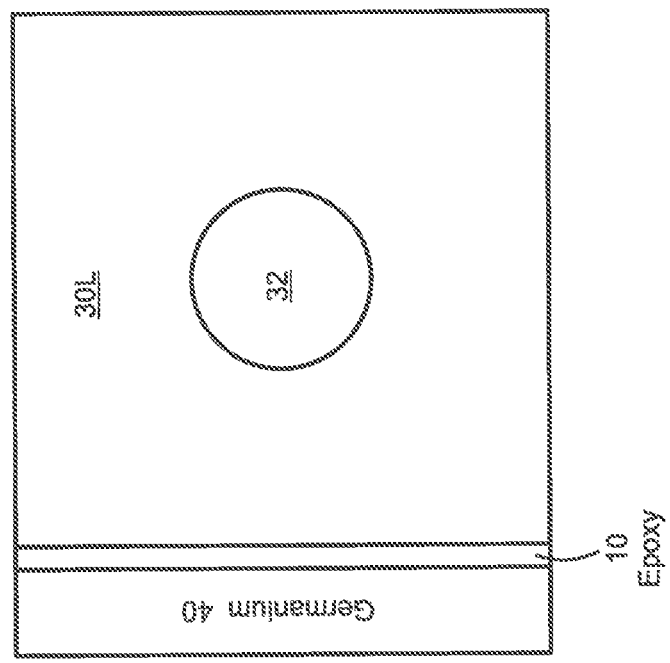
Figure 18B:
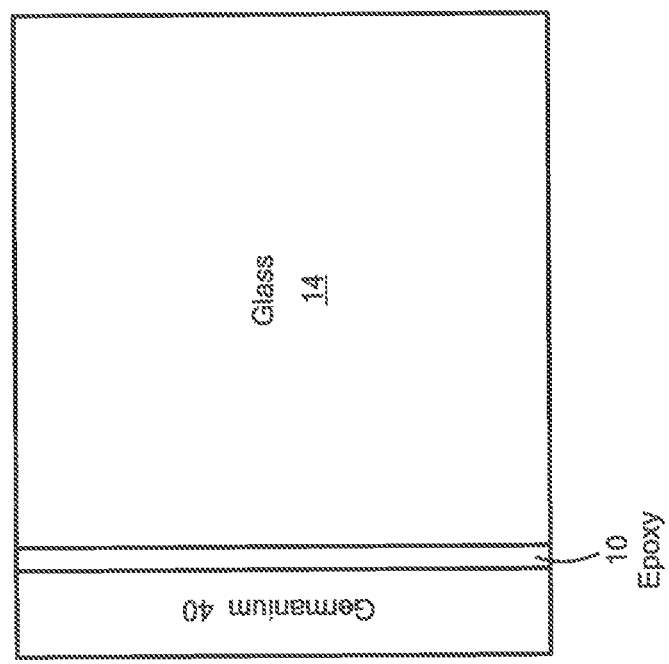

Next, the bond wires 32, 34 are attached to the ohmic contact electrode and Schottky contact electrode 28, as shown in FIGS. 3A, 3B and 3C Referring now to FIG. 17A through FIG. 25, the process for forming the SiC layer 16 with the UV radiation detector layer 18 thereon are on the glass layer 14 will be described. First, a germanium (Ge) crystal 40 (here having a thickness of from 1 mm to 10 mm) is affixed to one end of the structure shown in FIGS. 7A, 7B and 7C with any suitable high temperature (for example, greater than 200-400 degrees C.) epoxy 42, (for example EP30 or EP30HT (high temp) epoxy having a thickness ~10 to 20 um (micron) by Mastebond 154 Hobart Street, Hackensack <NJ. USA), as shown in FIGS. 18A, 18B and 18C with a portion 45 of the surface of the germanium (Ge) crystal 40 exposed as shown and with the <111> crystallographic surface of face of the Ge 40, facing to the right in FIGS. 18A, 18B and 18C by the arrow along the <111> crystallographic axis (the <11> axis being perpendicular to the <111> crystallographic surface or face of the Ge 40 This <111> crystallographic surface or face will serve as a seed layer for the formation of the CdS layer 18.

Figure 19:
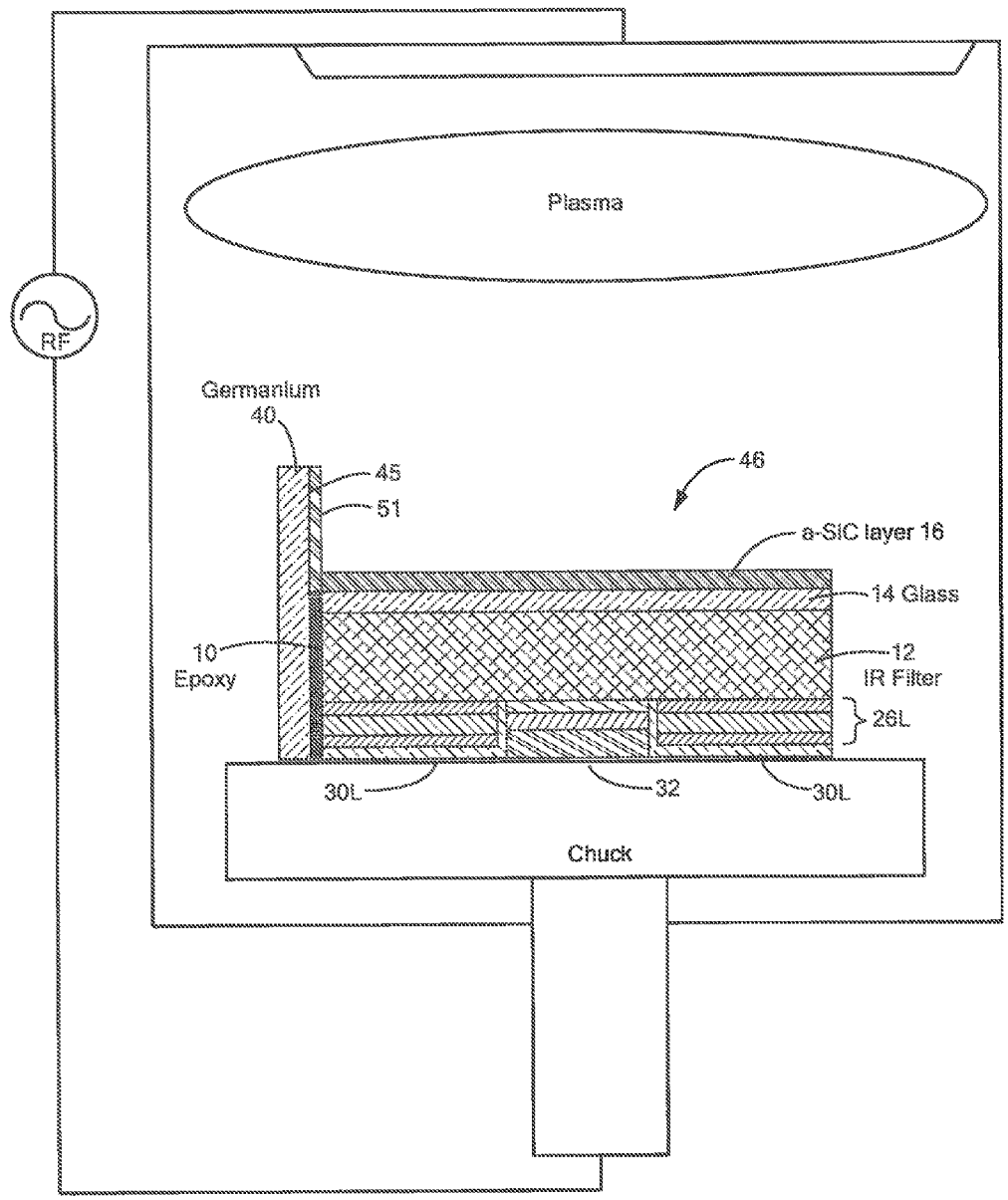

Next, referring to FIG. 18, the portion 45 of the surface of the germanium (Ge) crystal 40 is masked with a mask 51 and then is placed in a Plasma Enhance Chemical Vapor Deposition (PECVD) chamber, as shown in FIG. 19 for formation of the support layer 16 of amorphous SiC (α-SiC) (see for example "PECVD Amorphous Silicon Carbide (α-SiC) Layers for MEMS Applications "by Ciprian Iliescu and Daniel P. Poenar, INTECH, Physics and Technology of Silicon Carbide Devices, http://dx.doi.org/10.5772/51224 in a book edited by Yasuto Hijikata, ISBN 978-953-51-0917-4, Published: Oct. 16, 2012, http://dx.doi.org/10.5772/3428. The mask 51 prevents the α-SiC layer from being formed on the Ge 40. A low temperature deposition is used, for example, between 200-400 degrees Centigrade (depending on the specifics of the machine and recipe employed for the deposition, as well as on the details of the device's fabrication process). The α-SiC layer 16 here is formed to have an index of refraction, n, approximately, 2.5 and a final melting point 2,730° C. after deposition. In order to deposit an α-SiC layer 16 that has a high refractive index (~2.5) to match the AR requirements of the glass layer 14 below it) and has no epitaxial growth interference with the Ge (<111>) crystal 40 for the next step of CdS layer 18 deposition to be described, the α-SiC layer 16 must have the high temperature melting point of the final layer of α-SiC of 2,730 degrees Centigrade indicated above which is necessary for a CdS layer 18 recrystallization step (to be described) and thereby insure no damage to the layers already constructed.

Figure 20A:
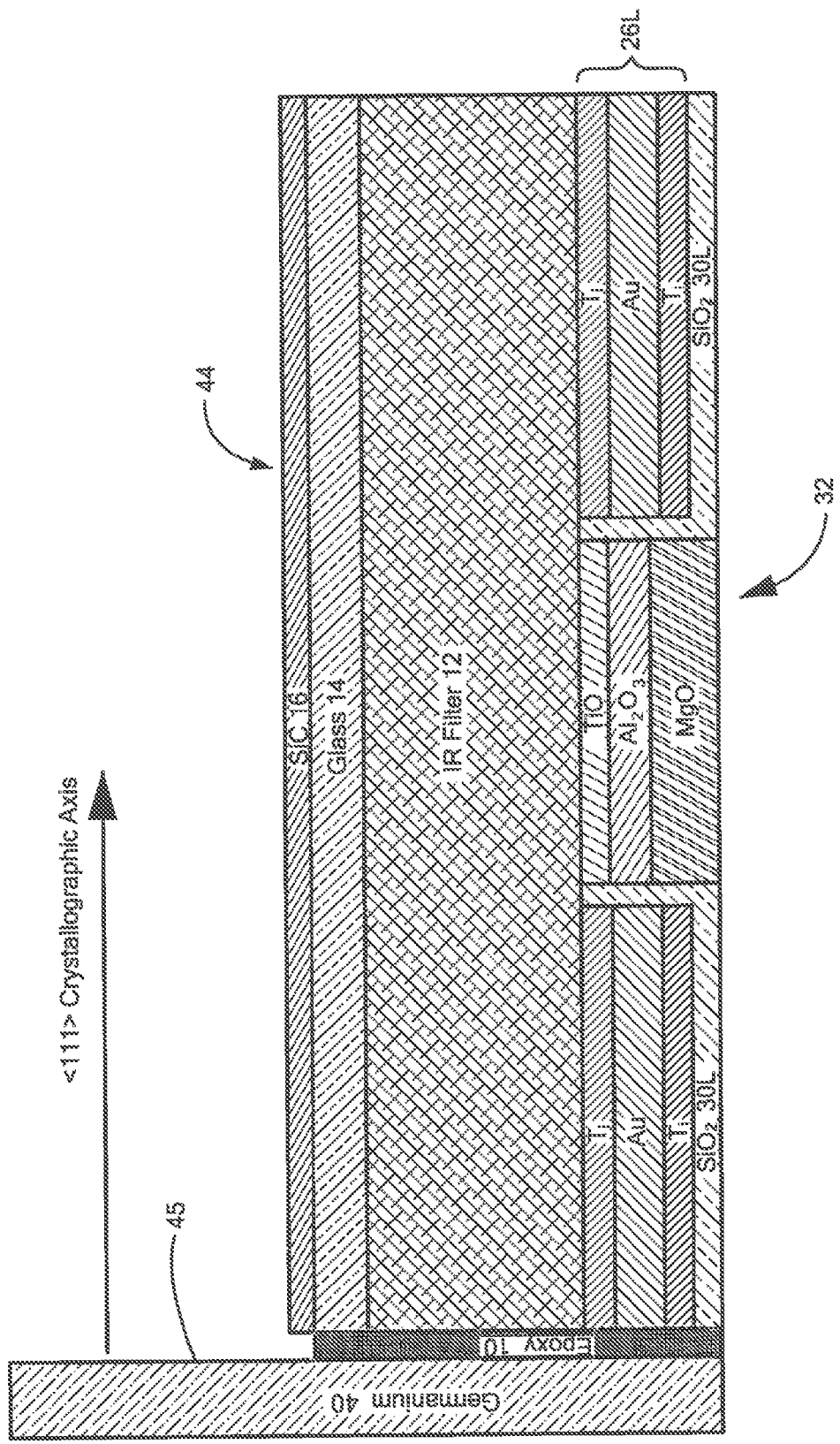
Figure 20C:
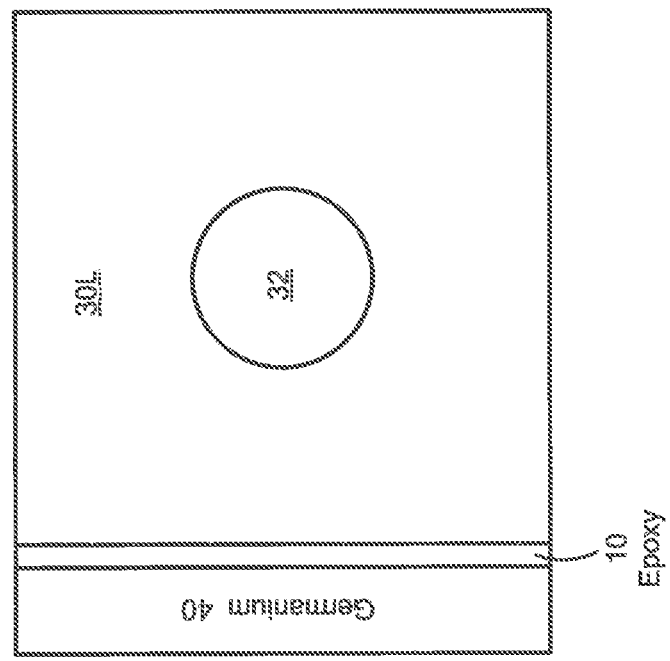
Figure 20B:
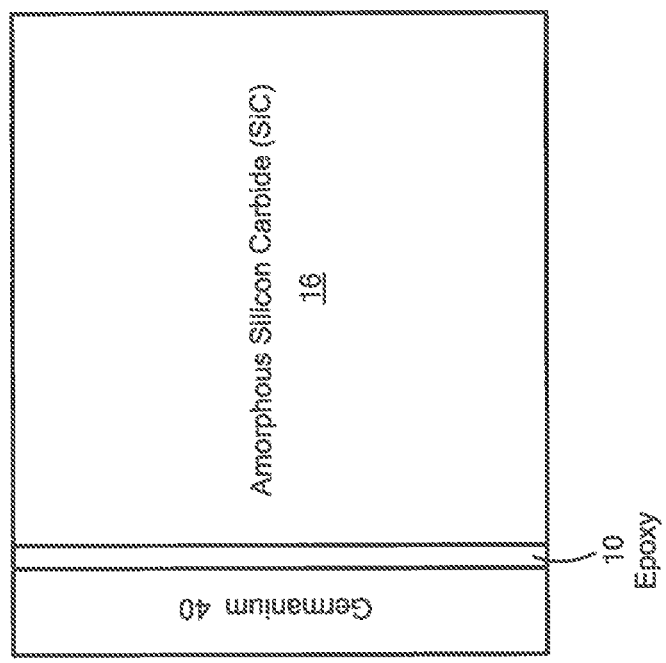
Figure 21:
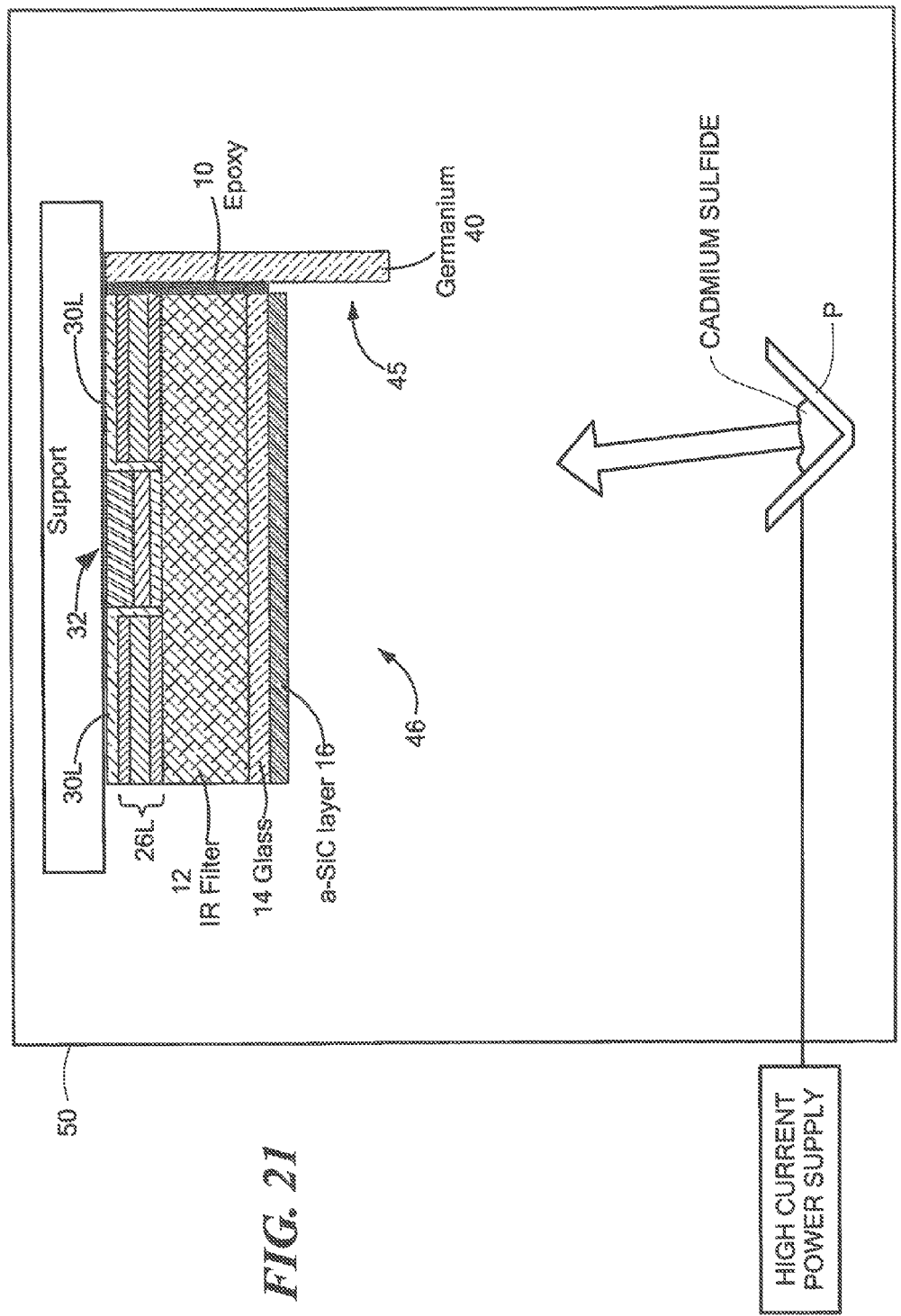
Figure 22:
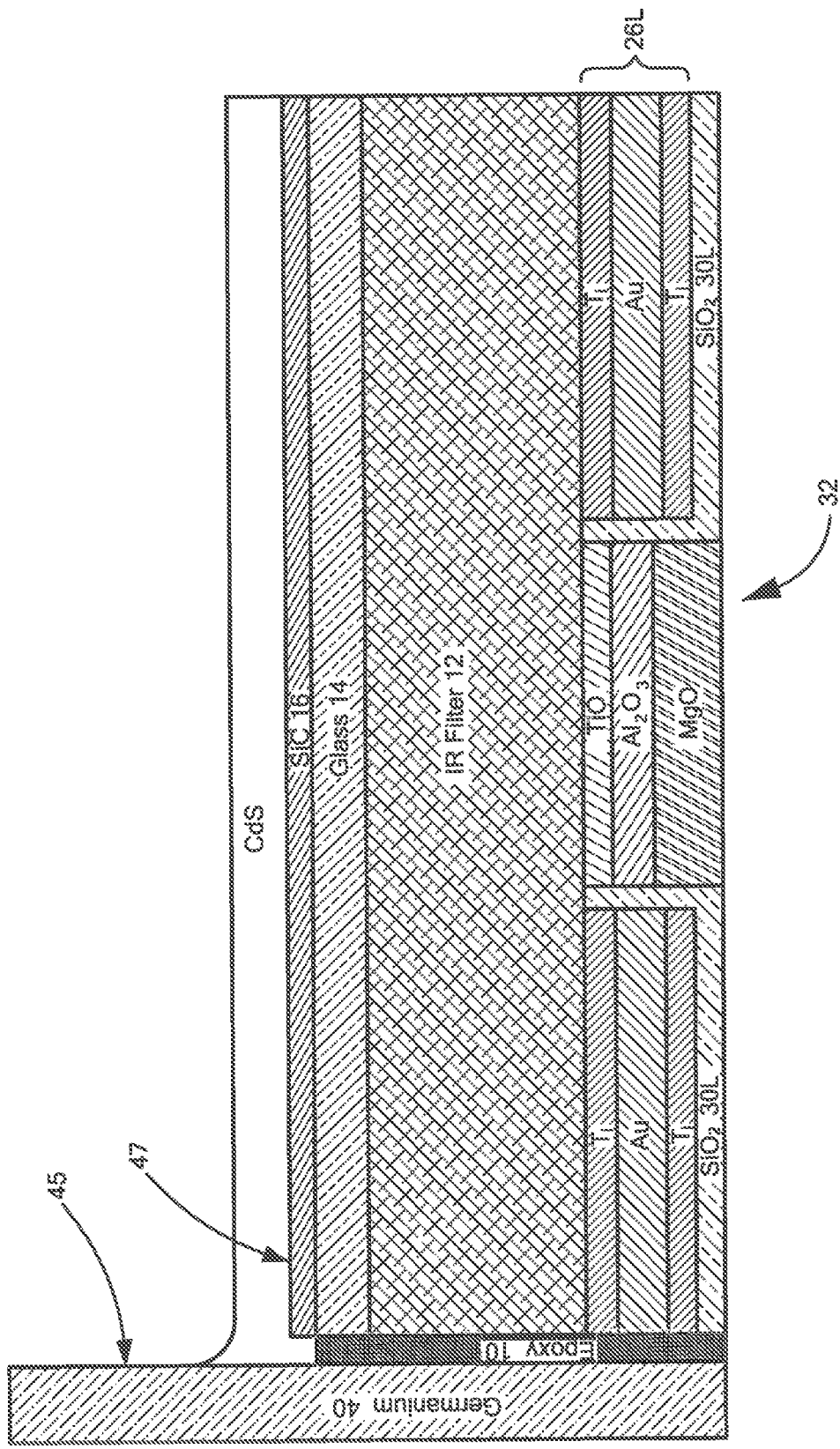

Next, after formation of the α-SiC layer 16, the mask 51 of the structure 46 is removed, as shown in FIG. 20 and then the structure is placed in a Chemical Vapor Deposition (CVD) chamber 50 (FIG. 21) to form the deposited CdS layer 18 on the exposed <111> crystallographic surface or face portion 45 of the Ge 40 and on portion 47 of the α-SiC layer 16 adjacent to the portion 45 of the Go 40 as indicated in FIG. 22. Contact with the Ge 40 will grow Hexagonal CdS crystals without crystal formation interference from the lower surface. Because the α-SiC is not a crystal surface, hexagonal CdS will propagate epitaxial growth far along the α-SiC surface 16. Therefore, a re-melting/recrystallization process using a pulse laser, to be described below, is used to insure that a small area/volume of the CVD grown CdS is melted as the laser pulse is applied and then cooled to re-crystallize the melted CdS when the laser pulse is removed to thereby propagate the hexagon —CdS, a few milli-meters from the Ge <111> face.

The CVD chamber 50 (FIG. 21) includes a pot P of CdS as shown, and heated by high current power supplies, as indicated. The crystal may not grow uniformly starting at the Ge <111> face but rather initially on the exposed <111> crystallographic surface or face portion 45 of the Ge 40 and on a portion 47 of the α-SiC layer 16 adjacent to the portion 45 of the Ge 40 as indicated in FIG. 22.

Figure 23A:
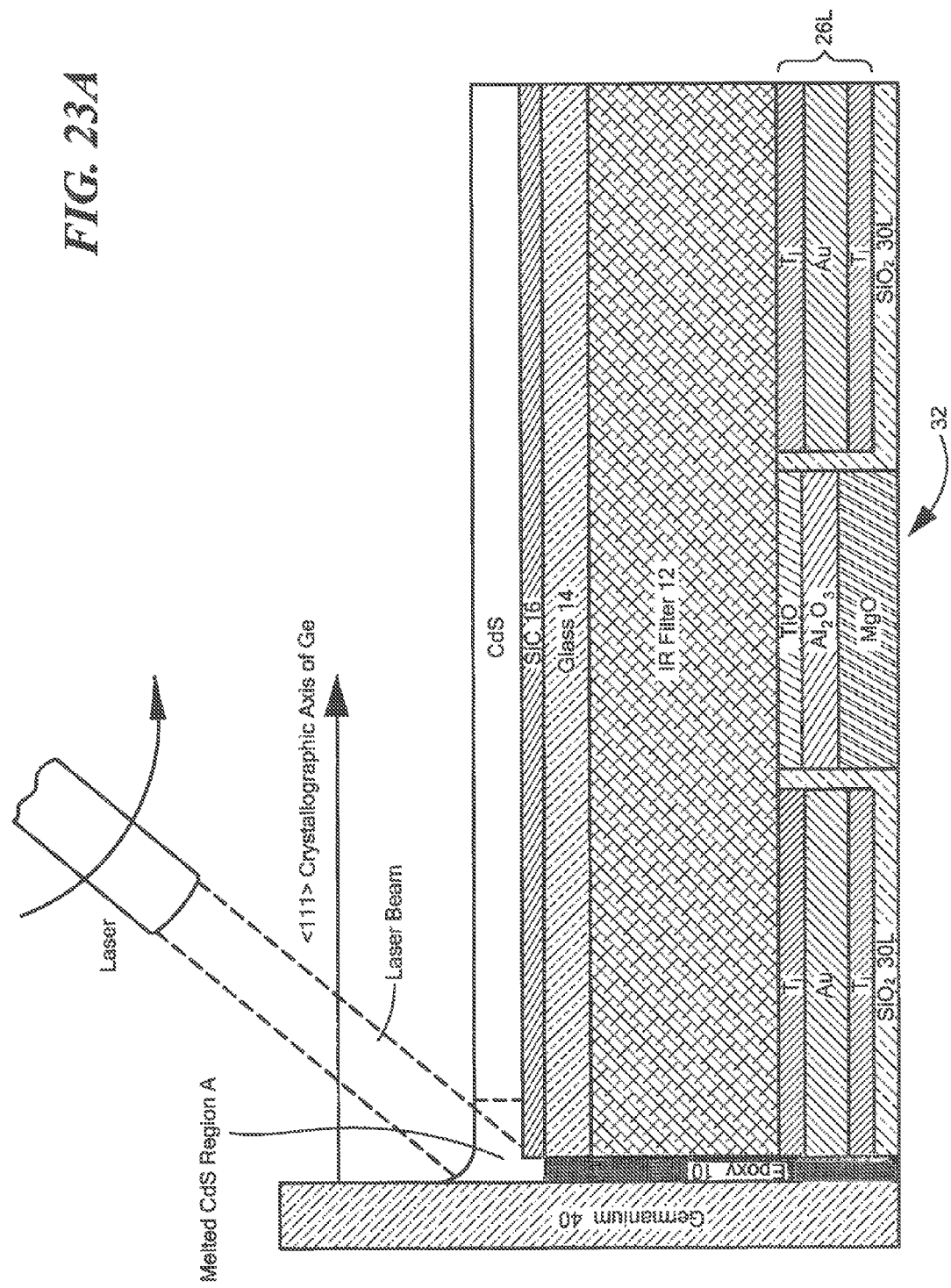

The structure shown in FIG. 22 is next removed from the Chemical Vapor Deposition (CVD) chamber 50 (FIG. 21). It is first noted that the crystallographic structure of the CVD CdS on the Ge is at this stage ambiguous. Thus a process is used re-anneal ambiguous CdS into a crystal form. Here, the re-anneal process is described in connection with FIGS. 23A and 23B. More particularly, a pulsed laser beam, here having a 2 mm square scan area (which is larger than the surface area of then CdS being scanned) begins a single scan of the initially CVD deposited CdS at the corner of the Ge <11> crystallographic surface and the SiC layer 16, as shown in FIG. 23A. (Here the laser is a Q-switched, ruby having a pulse 25 nanosecond pulse duration and fluence ranging from 0.1 to 1 Joules per cm$^2$).

Figure 23B:
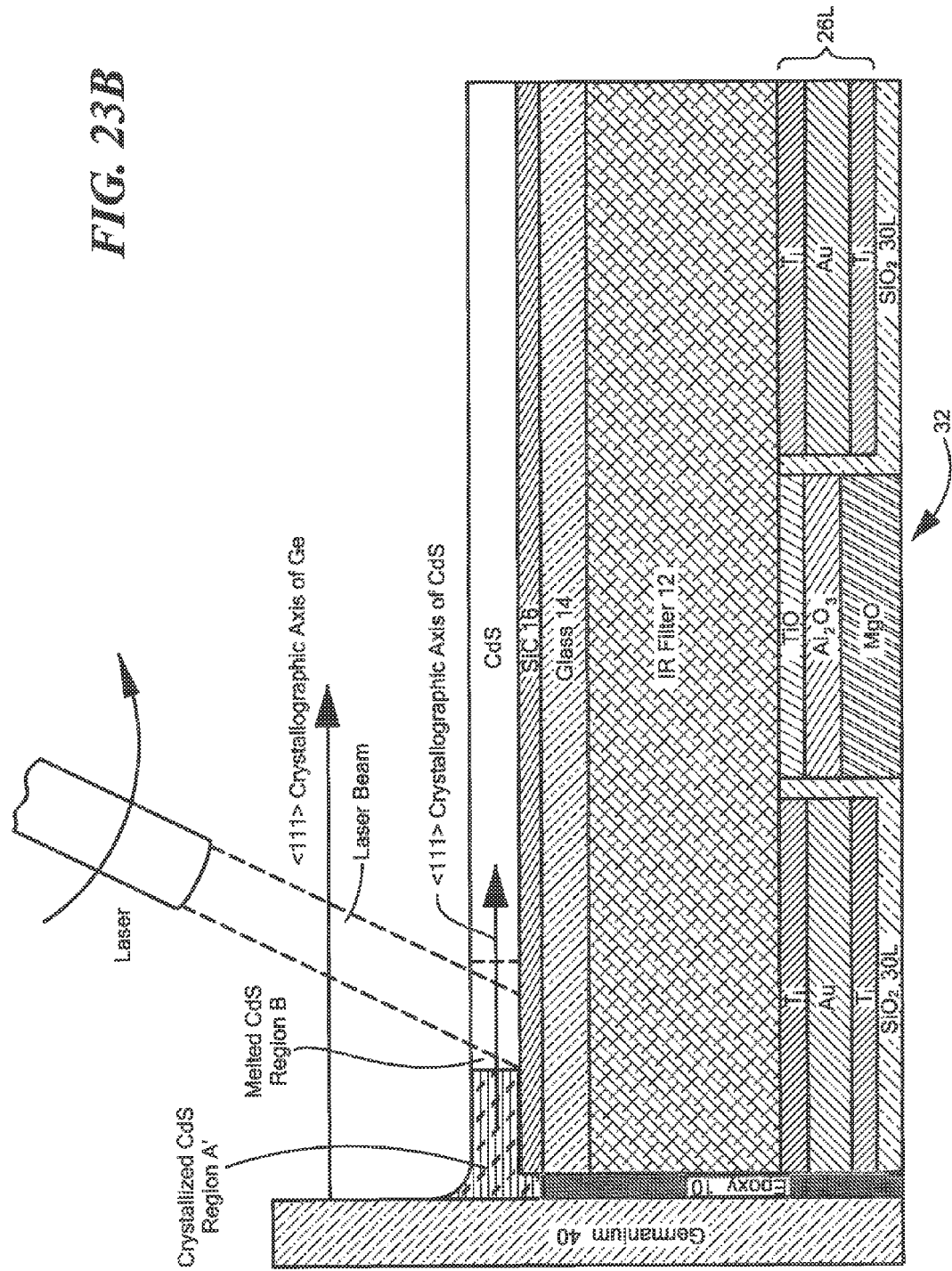
Figure 23C:
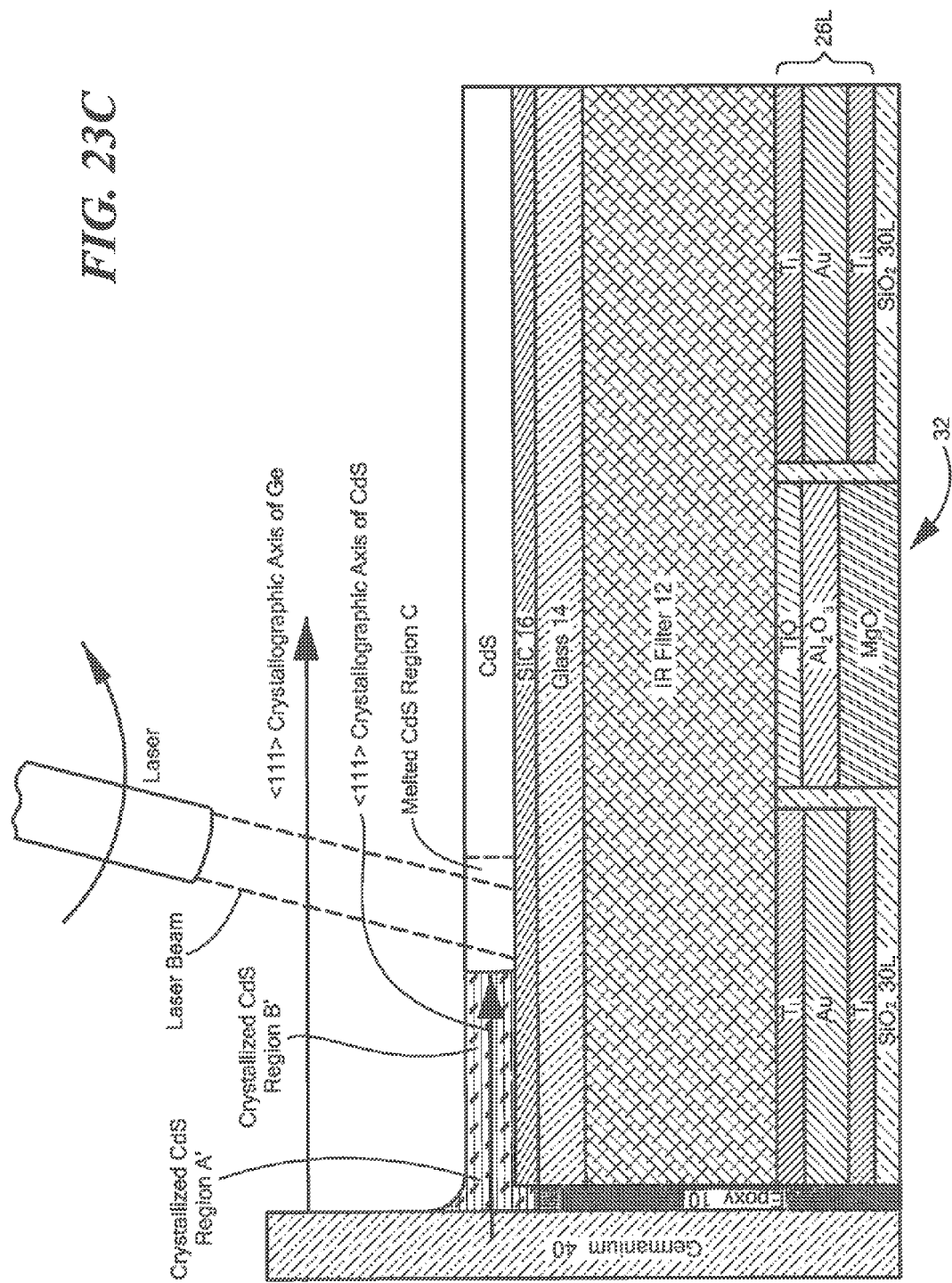
Figure 23D:
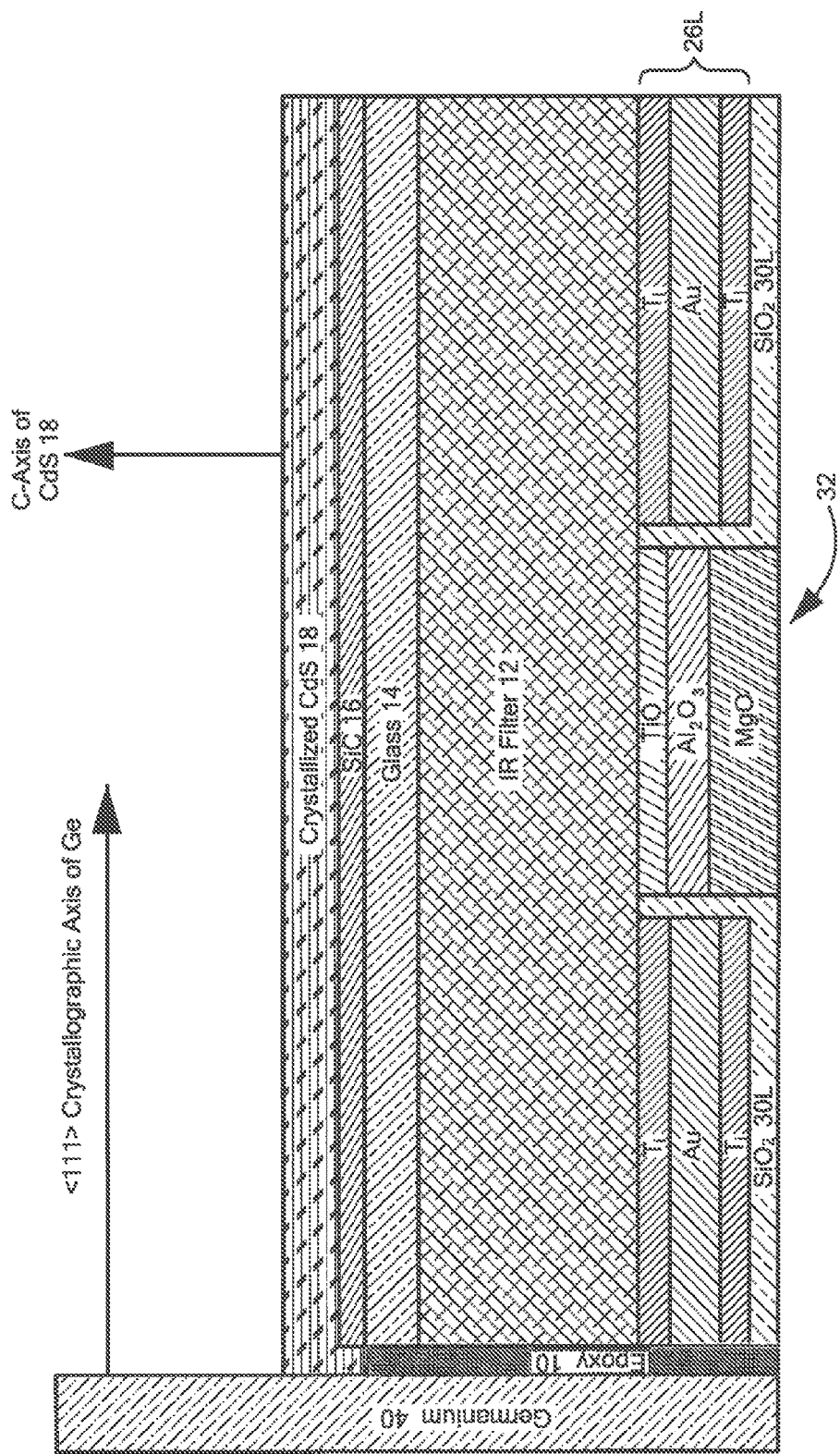

The heat from the laser beam melts a portion of the deposited CdS at that Ge <111> crystallographic surface (REGION A) and as the beam rotates along an arc, indicated by the curved arrow, the melted portion of the CdS in REGION A solidifies into a single crystal, hexagonal CdS portion, indicated as REGION A' (FIG. 23B). Now the laser beam melts the portion of the CdS adjacent to REGION A' to form a REGION B (FIG. 23B) of melted CdS and here again, as the laser beam scans away from REGION B, the melted CdS in REGION B cools on the single crystal CdS to form a single crystal, hexagonal CdS portion on the CdS in REGION B, as shown in FIG. 23C. Thus, the process continues and the single crystal, hexagonal CdS layer 18 grows upon itself and forms the layer 18 of CdS on the SiC layer, as indicated in FIG. 23D. It should be understood that the discussion above is for understanding the process and that the process is not a discrete process but rather a continuous process that produces a continuous single crystal, hexagonal CdS layer 18. A process used to re-anneal ambiguous CdS into a crystal form of the CdS with the pulsed laser is discussed in "PECVD Amorphous Silicon Carbide (α-SiC) Layers for MEMS Applications" referenced above and "Fast Melting of Amorphous Silicon Carbide Induced by Nanosecond Laser Pulse", P. Baeri, C. Spinella, and R. Reitano; *International Journal of Thermophysies, Vol.* 20, No. 4, 1999.

Thus, it is noted that re-melting and re crystallization is done in a single step serially away from the <111> Ge surface to generate a long hexagonal CdS crystal. The recrystallization of the CdS layer 18 with the pulsed laser is such that the hexagonal CdS layer 18 is grown on the <111> face of the Ge crystal 40 with the c-axis perpendicular to the surface of the CdS layer 18 being formed (that is, parallel to the parallel to a direction of the ultraviolet energy being detected using the re-melting technique discussed in the paper referenced above. This fast pulsed laser method does not over heat the layers around it such as the Ge 40 and glass layer 14. It is noted that the SiC it is amorphous and won't impact the CdS crystal; it can take the heat of the re-melt step; and it has an index of refraction which matches for that layer position in the stack for the IR "transmission. Thus the amorphous SiC support layer retards formation of imperfections in the single crystal UV radiation detecting material on the amorphous support layer during the successively heating and cooling.

Figure 24:
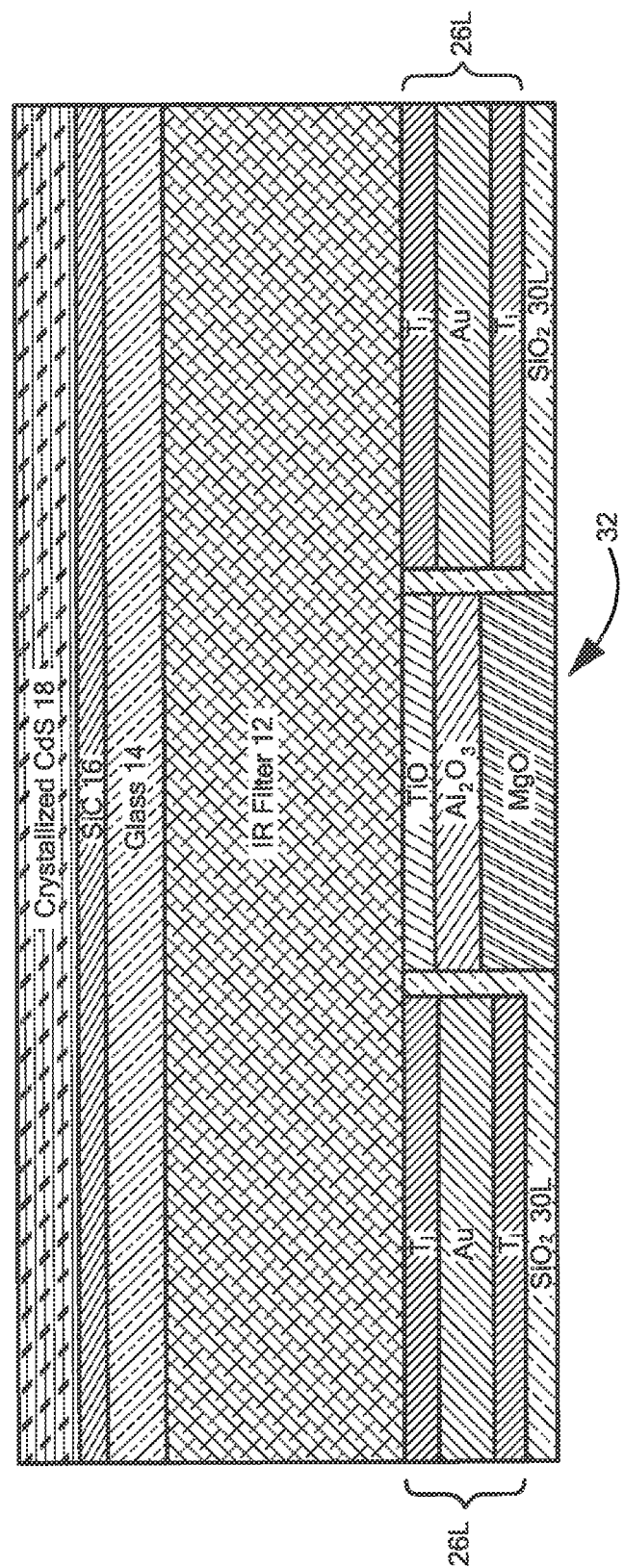

Next, here the epoxy 42, Go crystal 40, and any small amount of CdS layer 18 formed on the epoxy 42, as indicated in FIG. 25, is removed using mechanical polishing or any convenient solvent to produce the structure shown in FIG. 24; however, it should be noted that the epoxy, Ge 30, and small amount of CdS may remain with it being used in the processing described above in connection with FIGS. 3A through 16C.

A number of embodiments of the disclosure have been described. Nevertheless, it will be understood that various modifications may be made without departing from the spirit and scope of the disclosure. For example, other Group IV materials may be used in place of Ge, for example silicon wherein the CdS is grown on the <111> face of the silicon. Accordingly, other embodiments are within the scope of the following claims.

What is claimed is:

1. A method for forming an UV light detector, comprising:
providing a single crystal seed layer having a <111> crystallographic surface;
providing an amorphous support layer adjacent to the single crystal seed layer, the amorphous support layer having a supporting surface perpendicular to the <111> surface of the single crystal seed layer;
depositing a UV radiation detecting material on both the supporting surface and on a portion of the <111> crystallographic surface of the single crystal seed layer supporting surface;
converting the deposited UV radiation detecting material deposited on the supporting surface into single crystal UV radiation detecting material having a c-axis thereof perpendicular to the <111> crystallographic axis of the single crystal seed layer.

2. The method recited in claim 1 wherein the amorphous support layer retards formation of imperfections in the single crystal UV radiation detecting material on the amorphous support layer during successively heating and cooling during the converting.

3. The method recited in claim 1 the amorphous support layer is silicon carbide.

4. The method recited in claim 1 wherein the UV radiation detector material is Cadmium Sulfide, Cadmium Selenide or Cadmium Telluride.

5. The method recited in claim 1 wherein the amorphous support layer is transparent to infrared radiation.

6. The method recited in claim 5 the amorphous support layer is silicon carbide.

7. The method recited in claim 5 wherein the UV radiation detector material is Cadmium Sulfide, Cadmium Selenide or Cadmium Telluride.

8. The method recited in claim 1 wherein the processing comprises successively heating and cooling the deposited UV radiation detecting material.

9. A method for forming an UV light detector, comprising:
providing a single crystal seed layer having a <111> crystallographic surface;
providing an amorphous support layer adjacent to the single crystal seed layer, the amorphous support layer having a supporting surface perpendicular to the <111> surface of the single crystal seed layer;
depositing a UV radiation detecting material on both the supporting surface and on a portion of the <111> crystallographic surface of the single crystal seed layer adjacent to the supporting surface;
successively heating and cooling the deposited UV radiation detecting material forming a single crystal layer of the UV radiation detecting material on the supporting surface with such UV radiation detecting material on the single crystal seed layer being processed to extend outwardly from the single crystal seed layer to the supporting surface to convert the UV radiation detecting material on the supporting surface into UV radiation detecting material having a c-axis perpendicular to the supporting surface.

10. The method recited in claim 9 wherein the amorphous support layer retards imperfections in the single crystal UV radiation detecting material on the amorphous support layer during the successively heating and cooling.

11. The method recited in claim 9 the amorphous support layer is silicon carbide.

12. The method recited in claim 9 wherein the UV radiation detector material is Cadmium Sulfide, Cadmium Selenide or Cadmium Telluride.

13. The method recited in claim 9 wherein the amorphous support layer is transparent to infrared radiation.

14. The method recited in claim 13 the amorphous support layer is silicon carbide.

15. The method recited in claim 13 wherein the UV radiation detector material is Cadmium Sulfide, Cadmium Selenide or Cadmium Telluride.

16. A method for forming a radiation detector, comprising:
providing a single crystal seed layer having a surface with a predetermined crystallographic orientation;
providing an amorphous support layer adjacent to the single crystal seed layer, the amorphous support layer having a supporting surface perpendicular to the surface of the single crystal seed layer;
depositing radiation detecting material on both the supporting surface and on a portion of the surface of the single crystal seed layer adjacent to the supporting surface;
processing the radiation detecting material on the single crystal seed layer to use the processed radiation detecting material on the single crystal seed layer to convert the deposited radiation detecting material on the supporting surface into single crystal radiation detecting material having a c-axis perpendicular to the supporting surface.

17. The method recited in claim 16 wherein the processing comprises successively heating and cooling the deposited UV radiation detecting material.

18. A method for forming a radiation detector, comprising:
providing a single crystal seed layer having a surface having a predetermined crystallographic orientation;
forming an amorphous support layer, the amorphous support layer having a supporting surface perpendicular to the surface of the single crystal seed layer;
depositing a radiation detecting material on both the supporting surface and on a portion of the surface of the single crystal seed layer adjacent to the supporting surface;
processing the radiation detecting material on the single crystal seed layer to use the processed radiation detecting material on the single crystal seed layer to convert the deposited radiation detecting material on the supporting surface into single crystal radiation detecting material having a surface with a crystallographic orientation perpendicular to the crystallographic orientation of the surface of the seed layer.

19. The method recited in claim 18 wherein the processing comprises
successively heating and cooling the deposited UV radiation detecting material.

* * * * *